(12) United States Patent
Bando et al.

(10) Patent No.: US 11,257,990 B2
(45) Date of Patent: Feb. 22, 2022

(54) LIGHT EMITTING DEVICE

(71) Applicant: Nichia Corporation, Anan (JP)

(72) Inventors: Atsushi Bando, Itano-gun (JP); Kazuya Matsuda, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/143,349

(22) Filed: Sep. 26, 2018

(65) Prior Publication Data

US 2019/0103525 A1 Apr. 4, 2019

(30) Foreign Application Priority Data

Sep. 29, 2017 (JP) .............................. JP2017-190323
Feb. 21, 2018 (JP) .............................. JP2018-028355
May 8, 2018 (JP) .............................. JP2018-089696
Jul. 13, 2018 (JP) .............................. JP2018-133153
Aug. 20, 2018 (JP) .............................. JP2018-153832

(51) Int. Cl.
*H01L 33/50* (2010.01)
*H01L 25/075* (2006.01)
(Continued)

(52) U.S. Cl.
CPC ........ *H01L 33/504* (2013.01); *H01L 25/0753* (2013.01); *H01L 27/15* (2013.01);
(Continued)

(58) Field of Classification Search
CPC ..... H01L 33/504; H01L 33/50; H01L 33/501; H01L 33/502; H01L 33/48; H01L 33/52;
(Continued)

(56) References Cited

U.S. PATENT DOCUMENTS

2010/0134043 A1 6/2010 Kadotani et al.
2010/0244740 A1* 9/2010 Alpert ................... H01L 33/504
315/297
(Continued)

FOREIGN PATENT DOCUMENTS

EP 2 400 568 A2 12/2011
JP 2008-084967 A 4/2008
(Continued)

*Primary Examiner* — Marcos D. Pizarro
*Assistant Examiner* — Antonio B Crite
(74) *Attorney, Agent, or Firm* — Foley & Lardner LLP

(57) ABSTRACT

A light emitting device includes: a first light emitting element and a second light emitting element, each having a peak emission wavelength in a range of 430 nm to 480 nm; a first light transmissive member disposed on an upper face of the first light emitting element and containing a first phosphor; a second light transmissive member disposed on an upper face of the second light emitting element; and an encapsulant covering the first light transmissive member and the second light transmissive member and containing a second phosphor. The first light emitting element and the second light emitting element are configured to be independently driven. A chromaticity of light exiting from the first light transmissive member differs from a chromaticity of light exiting from the second light transmissive member.

22 Claims, 14 Drawing Sheets

(51) Int. Cl.
  *H01L 27/15* (2006.01)
  *H01L 33/52* (2010.01)
  *H01L 33/20* (2010.01)
  *H01L 33/58* (2010.01)
  *H01L 33/62* (2010.01)
(52) U.S. Cl.
  CPC ............ *H01L 33/50* (2013.01); *H01L 33/507* (2013.01); *H01L 33/52* (2013.01); *H01L 33/62* (2013.01)
(58) Field of Classification Search
  CPC ... H01L 33/507; H01L 33/62; H01L 25/0753; H01L 33/54
  See application file for complete search history.

(56) References Cited

U.S. PATENT DOCUMENTS

| | | | | |
|---|---|---|---|---|
| 2012/0169968 A1* | 7/2012 | Ishimori | ............. | G02B 6/0073 349/62 |
| 2012/0248469 A1* | 10/2012 | Choi | ..................... | H01L 33/508 257/88 |
| 2014/0138715 A1* | 5/2014 | Zhang | ................. | H01L 25/0753 257/88 |
| 2015/0008464 A1 | 1/2015 | Iwakura | | |
| 2015/0349224 A1* | 12/2015 | Ichihara | .............. | H01L 25/0753 257/89 |
| 2016/0284950 A1 | 9/2016 | Tseng | | |
| 2017/0103971 A1* | 4/2017 | Tamura | ................... | H01L 33/20 |
| 2017/0205565 A1* | 7/2017 | Akagawa | ............. | G02B 6/0068 |
| 2017/0278829 A1 | 9/2017 | Stoll et al. | | |
| 2018/0040780 A1* | 2/2018 | Hirasawa | ................ | H01L 33/62 |
| 2018/0259137 A1* | 9/2018 | Lee | ....................... | F21S 41/141 |

FOREIGN PATENT DOCUMENTS

| | | |
|---|---|---|
| JP | 2008-085026 A | 4/2008 |
| JP | 2009-267239 A | 11/2009 |
| JP | 2010-129583 A | 6/2010 |
| JP | 2010-182724 A | 8/2010 |
| JP | 2013-120812 A | 6/2013 |
| JP | 2015-012194 A | 1/2015 |
| JP | 2015-015371 A | 1/2015 |
| JP | 2015-126209 A | 7/2015 |
| KR | 20100030805 A | 3/2010 |
| KR | 20140039471 A | 4/2014 |
| WO | WO-2012/121304 A1 | 9/2012 |

* cited by examiner

LIGHT EMITTING DEVICE

CROSS-REFERENCE TO RELATED APPLICATION

This application claims priority to Japanese Patent Application No. 2017-190323 filed on Sep. 29, 2017; Japanese Patent Application No. 2018-028355 filed on Feb. 21, 2018; Japanese Patent Application No. 2018-089696 filed on May 8, 2018; Japanese Patent Application No. 2018-133153 filed on Jul. 13, 2018; and Japanese Patent Application No. 2018-153832 filed on Aug. 20, 2018, the disclosures of which are hereby incorporated by reference in their entireties.

BACKGROUND

The present disclosure relates to a light emitting device.

In general, light emitting devices employing light emitting elements, such as light emitting diodes or the like, are widely utilized as light sources of various devices, including lighting fixtures. As such a light emitting device, for example, Japanese Patent Publication No. 2013-120812 discloses a light emitting device comprising a plurality of light emitting elements, phosphors, and a package that individually supplies an electric current to each light emitting element. Such a light emitting device allows for adjustment of the emission intensity of each light emitting element to thereby emit light of a given color.

SUMMARY

It is, however, difficult for the light emitting device according to the above patent publication to emit light of a color across a broad chromaticity range.

Accordingly, the object of certain embodiment of the present disclosure is to provide a light emitting device capable of emitting light of a color across a broad chromaticity range.

The light emitting device according to certain embodiment of the present disclosure includes a first light emitting element, a second light emitting element, a first light transmissive member, a second light transmissive member, and an encapsulant. The first light emitting element and a second light emitting element each have a peak emission wavelength in a range of 430 nm to 480 nm. The first light transmissive member is disposed on an upper face of the first light emitting element and contains a first phosphor. The second light transmissive member is disposed on an upper face of the second light emitting element. The encapsulant covers the first light transmissive member and the second light transmissive member and contains a second phosphor. The first light emitting element and the second light emitting element can be independently driven. A chromaticity of light exiting from the first light transmissive member differs from a chromaticity of light exiting from the second light transmissive member.

An embodiment of the present disclosure can provide a light emitting device capable of emitting light of a color across a broad chromaticity range.

DETAILED DESCRIPTION

Figure 1A:
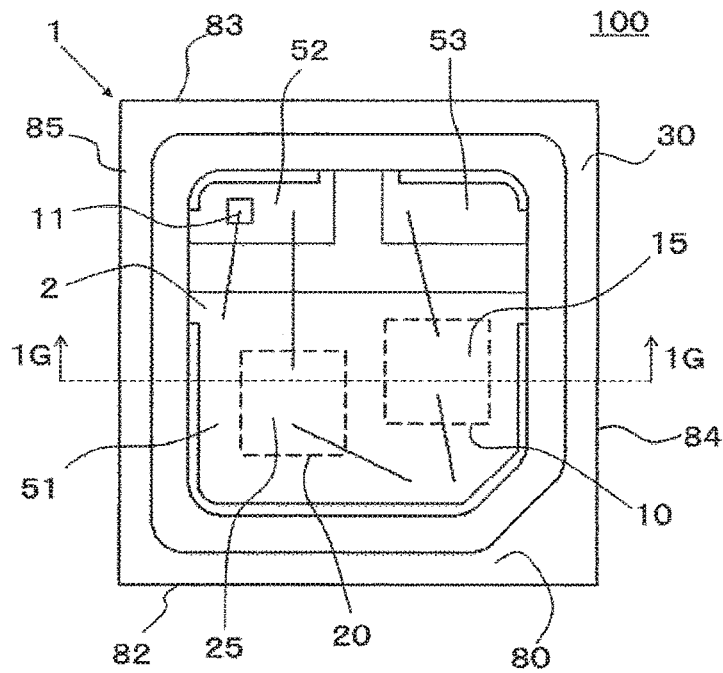
FIG. 1A is a schematic top view of the light emitting device according to a first embodiment.

Detailed explanations of embodiments of the present disclosure based on the accompanying drawings will follow. The same reference numerals appearing in multiple drawings show the same or equivalent parts or members.

The explanations below are for illustrating the light emitting devices to give shape to the technical ideas of the present invention without limiting the present invention to those described. The dimensions, materials, shapes, relative positions of the constituent parts are intended to illustrate examples unless otherwise specifically noted, without limiting the scope of the present invention to those described. The sizes of the members, the positional relationships and the like shown in each drawing might be exaggerated for the purpose of making the invention easily understood. The relationship between a color name and chromaticity coordinate, the relationship between a wavelength range of light and the color name of monochromatic light, and the like are in accordance with JIS Z8110.

In the description and the drawings herein, the X direction represents the horizontal direction, including both the right direction ($X_+$ direction) and the left direction ($X_-$ direction), and the Y direction represents the vertical direction, including both the upward direction ($Y_+$ direction) and the downward direction ($Y_-$ direction).

In the embodiments explained below, moreover, the same terms, such as "package," might be used before and after disposing light emitting elements, wires, and the like.

First Embodiment

Figure 1B:
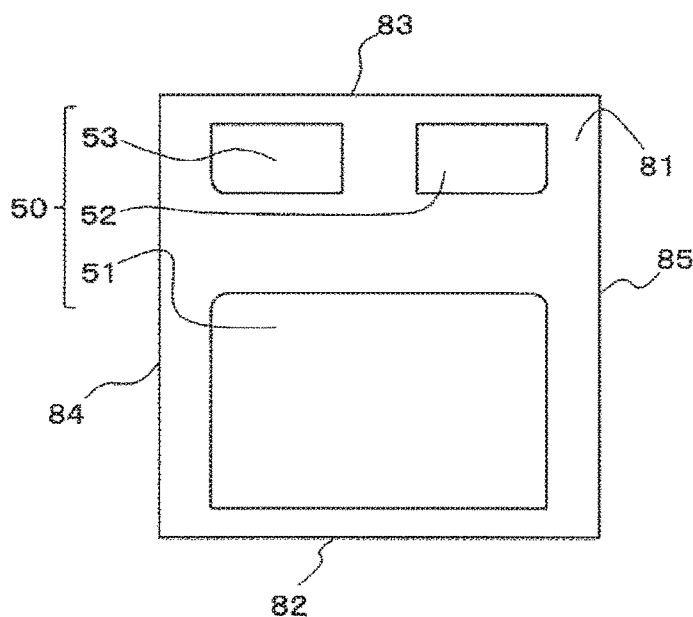
FIG. 1B is a schematic bottom view of the light emitting device according to the first embodiment.
Figure 1C:
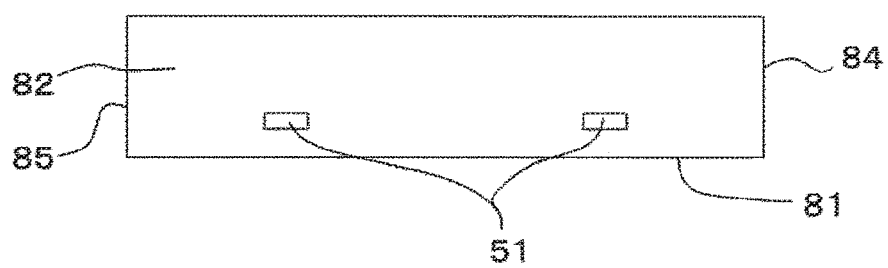
FIG. 1C is a schematic lateral side view of the light emitting device according to the first embodiment.
Figure 1D:
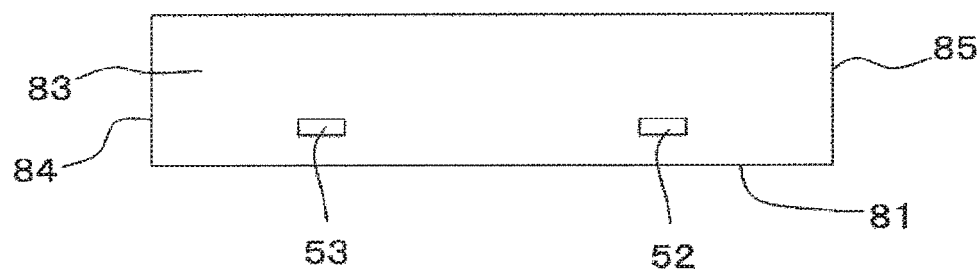
FIG. 1D is a schematic lateral side view of the light emitting device according to the first embodiment.
Figure 1E:
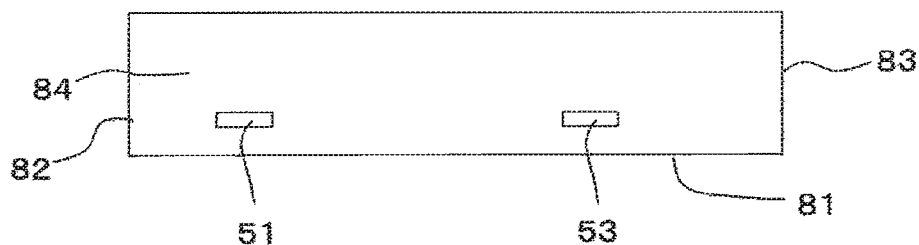
FIG. 1E is a schematic lateral side view of the light emitting device according to the first embodiment.
Figure 1F:
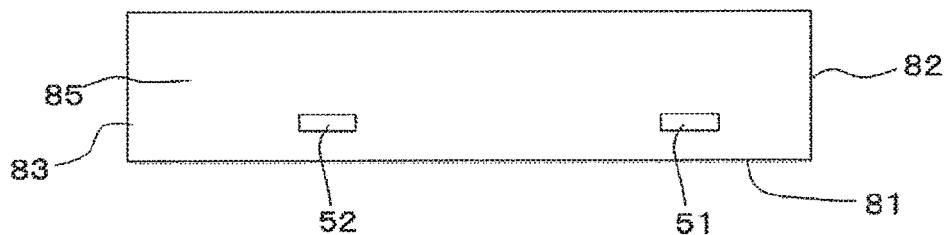
FIG. 1F is a schematic lateral side view of the light emitting device according to the first embodiment.
Figure 1G:
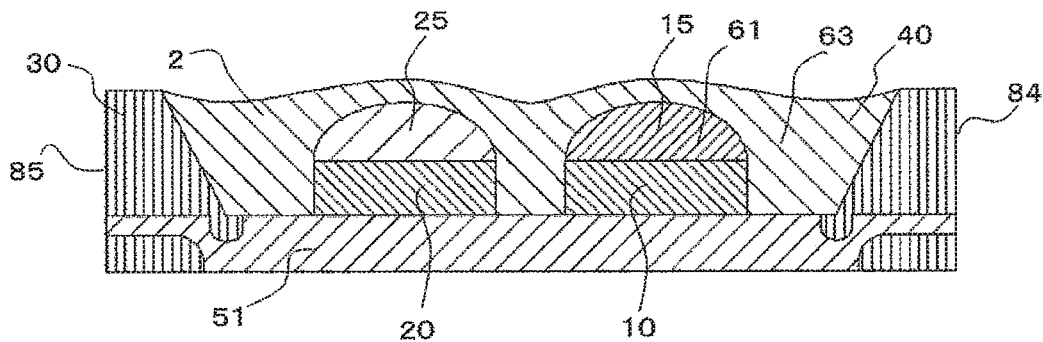
FIG. 1G is a schematic end view taken along the line 1G-1G in FIG. 1A.

FIG. 1A is a schematic top view of the light emitting device 100 according to a first embodiment, FIG. 1B is a schematic plan view of the light emitting device 100, FIGS. 1C to 1F are schematic lateral side views of the light emitting device 100, and FIG. 1G is a schematic end view taken along the line 1G-1G in FIG. 1A. In FIG. 1A, the encapsulant 40 is omitted to make the interior of the recess 2 easily understood, and the outlines of the first light emitting element 10 and the second light emitting element 20 are drawn using broken lines because the first light transmissive member 15 and the like are located on or above the upper faces of the light emitting elements. The light emitting device 100 includes a first light emitting element 10, a second light emitting element 20, a first light transmissive member 15 disposed on the upper face of the first light emitting element 10, and a second light transmissive member 25 disposed on the upper face of the second light emitting element 20. The first light transmissive member 15 and the second light transmissive member 25 are covered by the encapsulant 40. The light emitting device 100 according to the first embodiment further includes a package 1 that has a recess 2, and the first light emitting element 10 and the second light emitting element 20 are disposed on the bottom face of the recess 2.

The package 1 is a base for disposing the first light emitting element 10 and the second light emitting element 20. The package 1 has a plurality of leads 50, including a first lead 51, a second lead 52, and a third lead 53, and a resin part 30 formed integrally with the leads 50. The package 1 has a recess 2, and a portion of the upper face of each of the first lead 51, the second lead 52, and the third lead 53 is located at the bottom of the recess 2.

The package 1 shown in FIG. 1A and FIG. 1B has an upper face 80 and a lower face 81 located opposite the upper face 80. Furthermore, the package 1 has a substantially rectangular outer shape in a top view, and a first outer lateral face 82, a second outer lateral face 83 located opposite the first outer lateral face 82, a third outer lateral face 84, and a fourth outer lateral face 85 located opposite the third lateral face 83. FIG. 1C to FIG. 1F successively show the first outer lateral face 82, the second outer lateral face 83, the third outer lateral face 84, and the fourth outer lateral face 85. The first lead 51 is exposed from the resin part 30 on the first outer lateral face 82, the third outer lateral face 84, and the fourth outer lateral face 85. The first lead 51 and the resin part 30 are substantially coplanar. The second lead 52 is exposed from the resin part 30 at the second outer lateral face 83 and the fourth outer lateral face 85. The second lead 52 and the resin part 30 are substantially coplanar. The third lead 53 is exposed from the resin part 30 on the second outer lateral face 83 and the third outer lateral face 84. The third lead 53 and the resin part 30 are substantially coplanar. Because the first lead 51, the second lead 52, and the third lead 53 do not extend out of the resin part 30 at the four outer lateral faces as described above, a compact light emitting device 100 having a small occupying area can be provided.

The lower face 81 of the package 1 functions as the mounting face for the light emitting device 100 to be mounted on a mounting substrate. Furthermore, the first lead 51, the second lead 52, and the third lead 53 are exposed from the resin part 30 on the lower face 81 of the package 1. This allows the heat generated by the first light emitting element 10 and the second light emitting element 20 to be efficiently dissipated from the lower face 81 of the package 1. Moreover, the lower faces of the leads 50 are formed substantially coplanar with the lower face of the resin part 30 on the lower face 81 of the package 1.

The first light emitting element 10 and the second light emitting element 20 function as the light sources for the light emitting device 100 as well as the excitation sources for the phosphors described later. The first light emitting element 10 and the second light emitting element 20 each have a peak emission wavelength of from 430 nm to 480 nm. Employing the first light emitting element 10 and the second light emitting element 20 each having a longer peak emission wavelength than the near-ultraviolet spectral region can reduce issues related to light in the near-ultraviolet region, such as adverse effects on the human body or irradiated objects, and deterioration of components to thereby considerably reduce the emission efficiency of the light emitting device.

The first light emitting element 10 and the second light emitting element 20 are connected in parallel. In this way, the electric current values can be independently set for the first light emitting element 10 and the second light emitting element 20. For example, the first light emitting element 10 and the second light emitting element 20 can be driven at different electric current values. In the light emitting device 100 shown in FIG. 1A, the first light emitting element 10 and the second light emitting element 20 are disposed on the upper face of the first lead 51. The first light emitting element 10 has positive and negative electrodes on the upper face, and one of the positive and negative electrodes is electrically connected to the second lead 52 via a wire while the other electrode is electrically connected to the first lead 51 via another wire. Similarly, the second light emitting element 20 has positive and negative electrodes on the upper face, and one of the positive and negative electrodes is electrically connected to the third lead 53 via a wire while the other electrode is electrically connected to the first lead 51 via another wire. Providing the light emitting device 100 with three leads in this manner enables independent driving of each light emitting element. Furthermore, reducing the number of leads 50 as much as possible while enabling independent driving can reduce the number of interfaces between the leads and the package 1. This, as a result, attenuates the strength decline of the light emitting device.

The first light emitting element 10 and the second light emitting element 20 are preferably disposed without any partition such as a wall therebetween. This can improve the color mixing properties of the light emitting device 100. Specifically, in the light emitting device 100 shown in FIG. 1A, the first light emitting element 10 and the second light emitting element 20 are disposed in a housing part (i.e., the recess 2), and there is no partition such as a wall disposed between the first light emitting element 10 and the second light emitting element 20. This facilitates mixing of the light near the first light emitting element 10 and the light near the second light emitting element 20, resulting in a light emitting device having good color mixing properties. For example, in the case of mixing the light from the light emitting device 100 by using another member such as a lamp, a partition such as a wall may be disposed between the first light emitting element 10 and the second light emitting element 20.

In the light emitting device 100 shown in FIG. 1A, the first light emitting element 10 and the second light emitting element 20 are disposed apart from one another when viewed from the top. The center of the first light emitting element 10 is preferably out of alignment with the center of the second light emitting element 20 in both the X and Y directions when viewed from the top. In other words, the shortest distance from the first outer lateral face 82 of the package 1 to the center of the first light emitting element 10 preferably differs from the shortest distance from the first outer lateral face 82 to the center of the second light emitting element 20, and the shortest distance from the third outer lateral face 84 to the center of the first light emitting element 10 preferably differs from the shortest distance from the third outer lateral face 84 to the center of the second light emitting element 20. Disposing the first light emitting element 10 and the second light emitting element 20 out of alignment when viewed from the top can reduce the percentage of the light emitted by one of the light emitting elements that is absorbed by the other light emitting element, thereby producing a light emitting device that allows for good light extraction.

The light emitting device 100 includes a first light transmissive member 15 disposed on the upper face of the first light emitting element 10 and a second light transmissive member 25 disposed on the upper face of the second light emitting element 20. In the light emitting device 100 according to the first embodiment, the first light transmissive member 15 contains a first phosphor 61, but the second light transmissive member 25 is substantially free of phosphor. This can easily create a difference between the chromaticity of the light exiting from the first light transmissive member 15 and the chromaticity of the light exiting from the second light transmissive member 25.

The first phosphor 61, for example, is a red phosphor that emits red light. The chromaticity of light in the 1931 CIE chromaticity diagram generally tends to have a high x chromaticity value when the content of the red component is high. Accordingly, employing a red phosphor for the first phosphor 61 can easily create a difference between the chromaticity (particularly the x value) of the light exited from the first light transmissive member 15 and the chromaticity of the light exited from the second light transmissive member 25. For the first phosphor 61, for example, a red phosphor having large full width at half maximum is preferably used. This can enhance the color rendering properties of the light emitting device 100. The full width at half maximum of a red phosphor is, for example, in a range of 80 nm to 100 nm, preferably from 85 nm to 95 nm. For such a first phosphor 61, a red phosphor having the composition represented by the formula (1) below, for example, can be used.

$$(Sr,Ca)AlSiN_3{:}Eu \qquad (1)$$

Employing a red phosphor having the composition represented by the formula (1) can enhance the color rendering properties of the light emitting device as well as improving extraction of light from the light emitting device.

Furthermore, content of the first phosphor 61 is, for example, in a range of 50 to 150 wt % relative to the total weight of the first light transmissive member 15.

The second light transmissive member 25 is substantially free of phosphor. Accordingly, the vast majority of the light exited from the second light transmissive member 25 would be the light from the second light emitting element 20 with a high content of a blue component (i.e., peak emission wavelength in a range of 430 nm to 480 nm). In this way, the light exited from the second light transmissive member 25 will have a relatively small x chromaticity value, easily creating a difference between the chromaticity of the light exited from the first light transmissive member 15 and the chromaticity of the light exited from the second light transmissive member 25.

Moreover, disposing the second light transmissive member 25 on the upper face of the second light emitting element 20 can reduce the amount of a second phosphor 63 (described below) located above the second light emitting element 20. This reduces the percentage of the light exiting upward from the second light emitting element 20 that is excited by the second phosphor 63. Accordingly, in the case in which the second phosphor 63 contains a yellow to red phosphor, for example, the light exiting upward from the second light emitting element 20 can have a relatively small x chromaticity value as compared to the light emitting device having no second light transmissive member 25. This, as a result, can more easily create a difference between the chromaticity of the light exiting from the first light transmissive member 15 and the chromaticity of the light exiting from the second light transmissive member 25.

The first light transmissive member 15 and the second light transmissive member 25 preferably cover only the upper faces of the light emitting elements. In other words, the first light transmissive member 15 and the second light transmissive member 25 preferably cover the upper faces of the light emitting elements without covering the lateral faces of the light emitting elements. In this way, using a phosphor having a high excitation efficiency for the second phosphor 63 in the encapsulant 40, for example, can efficiently excite the light exited laterally from the light emitting elements. This results in a light emitting device that allows for good light extraction.

In the case of applying a liquid resin material for the first light transmissive member 15 and the second light transmissive member 25 on the upper faces of the light emitting elements, the surface tension works at the edges of the upper faces of the light emitting elements to hold the spreading of the resin material within the edges of the light emitting elements. This can stably shape the first light transmissive members 15 and the second light transmissive members 25 in the case of manufacturing a plurality of light emitting devices, thereby increasing the production yield. Moreover, forming the first light transmissive member 15 and the second light transmissive member 25 in a stable manner can produce a light emitting device having a desirable light distribution.

The first light transmissive member 15 and the second light transmissive member 25 can be formed using various methods. For example, the first light transmissive member 15 and the like can be formed by printing, potting, or spraying a resin material, or by adhering a resin member in a sheet or block shape using an adhesive or the like. Furthermore, a light transmissive member containing a phosphor may be formed, for example, by electrophoretic deposition.

In the light emitting device 100 shown in FIG. 1G, the first light transmissive member 15 and the second light transmissive member 25 are spaced apart. Part of the encapsulant 40 is present between the first light transmissive member 15 and the second light transmissive member 25. Forming the first light transmissive member 15 and the second light transmissive member 25 as non-continuous members can reduce the interference between the light emitted by the first light source (i.e., the first light emitting element 10 and the first light transmissive member 15) and the light emitted by the second light source (i.e., the second light emitting element 20 and the second light transmissive member 25). This can facilitate independent adjustment of the chromaticity of the first light source and the chromaticity of the second light source.

The encapsulant 40 covers the first light transmissive member 15 and the second light transmissive member 25. In the light emitting device 100 shown in FIG. 1G, the encapsulant 40 is located inside the recess 2, covering the upper face of the first light transmissive member 15, the upper face of the second light transmissive member 25, the lateral faces of the first light emitting element 10, and the lateral faces of the second light emitting element 20.

The encapsulant 40 contains a second phosphor 63. The second phosphor 63 may be configured by one type or multiple types of phosphors. Employing multiple types of phosphors can improve the color rendering properties of the light emitting device 100. The second phosphor 63, for example, contains a phosphor having the composition represented by the formula (2) below, and a red phosphor having the composition represented by the formula (3) below.

$$(Y,Lu,Gd)_3(Al,Ga)_5O_{12}:Ce \quad (2)$$

$$(Sr,Ca)AlSiN_3:Eu \quad (3)$$

In the case of driving only the first light emitting element 10, the light emitting device 100 can emit light having a color temperature in a range of 1800 to 5000 K. In the case of driving only the second light emitting element 20, the color temperature of the light emitting device 100 is set to be higher than the color temperature of the light emitting device 100 in the case of driving only the first light emitting element 10, for example, to be able to emit light having a color temperature in a range of 3500 to 7000 K. Furthermore, the light emitting device 100 can emit light having a color temperature in a range of 1800 to 7000 K by adjusting the electric current value for each of the first light emitting element 10 and the second light emitting element 20. This can result in a light emitting device capable of emitting light having an emission color across a broad range of correlated color temperatures.

Figure 2:
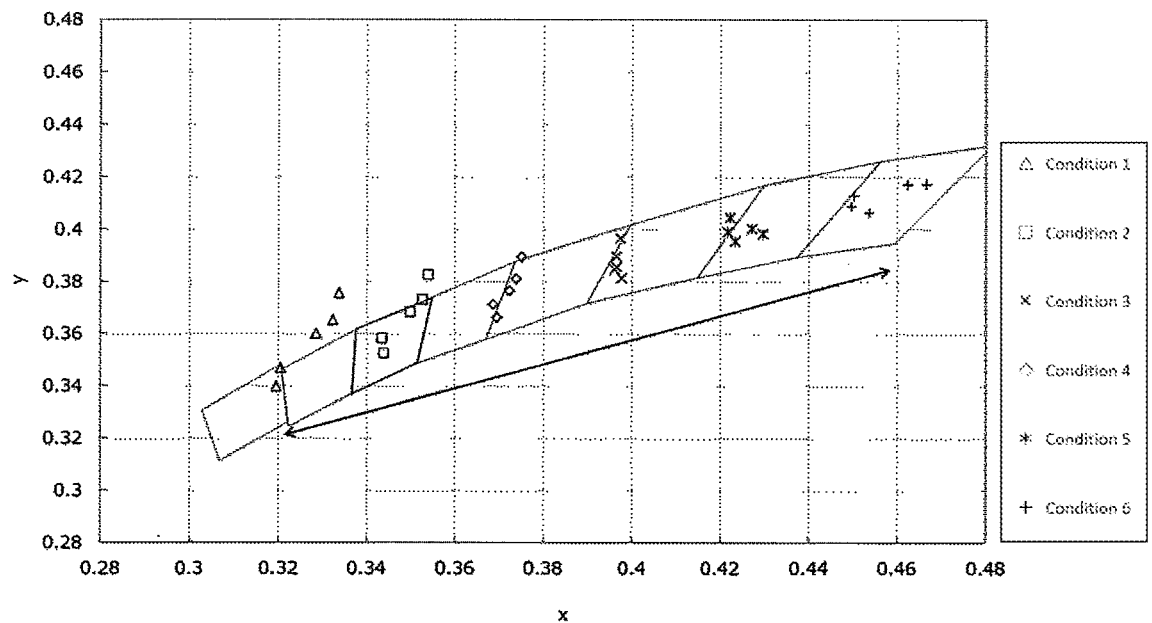
FIG. 2 is a diagram showing the chromaticity of the light emitting device according to the first embodiment.

FIG. 2 is a diagram showing examples of the chromaticity of the light emitting device 100 plotted on the 1931 CIE chromaticity diagram. FIG. 2 shows the chromaticity of the light emitting device 100 by driving the first light emitting element 10 and the second light emitting element 20 under six conditions in which the electric current values are varied. The six conditions are: a first condition (first light emitting element: 65 mA, second light emitting element: 0 mA); a second condition (first light emitting element: 52 mA, second light emitting element: 13 mA); a third condition (first light emitting element: 26 mA, second light emitting element: 39 mA); a fourth condition (first light emitting element: 39 mA, second light emitting element: 26 mA); a fifth condition (first light emitting element: 13 mA, second light emitting element: 52 mA); a the sixth condition (first light emitting element: 0 mA, second light emitting element: 65 mA). The chromaticity of the light emitting device under the first condition represents the chromaticity of the light emitting device 100 when only the first light emitting element 10 is driven, and the chromaticity of the light emitting device under the sixth condition represents the chromaticity of the light emitting device 100 when only the second light emitting element 20 is driven.

Under the first condition, the light emitting device 100 emits light having a color temperature in a range of 2700 to 3000 K, and under the sixth condition, the light emitting device 100 emits light having a color temperature in a range of 5000 to 6500 K. Moreover, the light emitting device 100 can emit light having a color temperature in a range of 2700 to 6500 K by adjusting the values of the electric current supplied to the first light emitting element 10 and the second light emitting element 20. Accordingly, a light emitting device can be provided that can emit light having an emission color across a broad range of correlated color temperatures.

Each member employed in the light emitting device 100 according to the present invention will be explained in detail below.

Package

The package 1 is the base used for disposing a light emitting element. The package 1 includes at least a base body and a plurality of leads (i.e., a plurality of electrode parts). Examples of the material for forming the base body include ceramic (e.g., aluminum oxide, aluminum nitride), resins (e.g., silicone resins, silicone modified resins, epoxy resins, epoxy modified resins, unsaturated polyester resins, phenol resins, polycarbonate resins, acrylic resins, trimethylpentane resins, polynorbornene resins, or hybrid resins containing at least one of these resins), pulp, glass, or composite materials of these. The base body of the package 1 may be of a single layer structure or a multilayer structure having multiple layers.

As an example of the package 1, one including the resin part 30 and the leads 50 used in the light emitting device 100 shown in FIG. 1A can suitably be used. This can produce a light emitting device that is inexpensive and has good heat dissipation properties. In the light emitting device 100 shown in FIG. 1A, the leads 50 do not extend out of the resin part 30 on the outer lateral faces, however the light emitting device according to this embodiment is not limited to this. That is, the leads 50 may extend out of the resin part 30 at the outer lateral faces of the package 1. This allows the heat generated by the light emitting elements to be efficiently dissipated outwards.

Figure 3A:
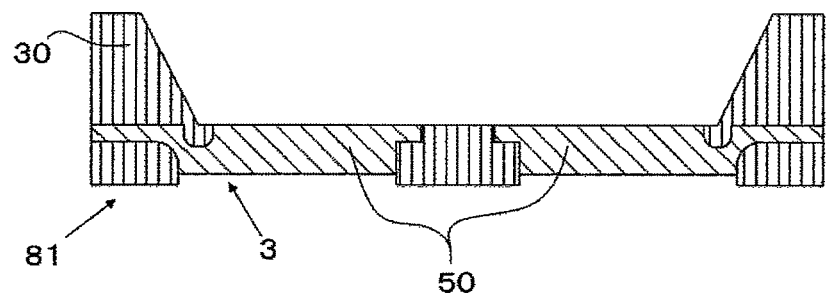
FIG. 3A is a schematic end view explaining an example of the bottom face of a package.
Figure 3B:
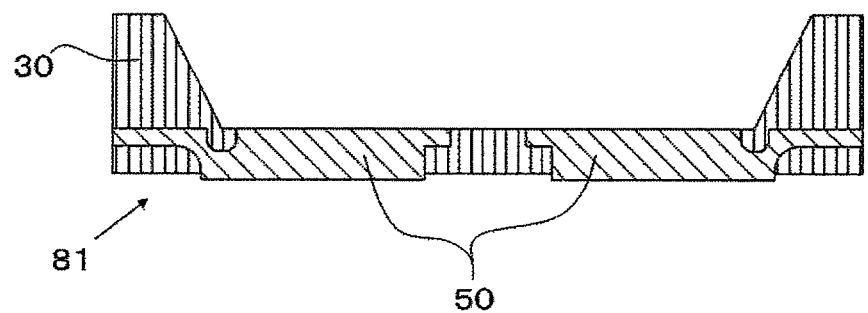
FIG. 3B is a schematic end view explaining an example of the bottom face of a package.

Furthermore, in the light emitting device 100 shown in FIG. 1G, the lower faces of the leads 50 are substantially coplanar with the lower face of the resin part 30, however the light emitting device according to the present invention is not limited to this. For example, as shown in FIG. 3A, the lower faces of the leads 50 may be positioned higher than the lower face of the resin part 30 at the lower face 81 of the package 1. This creates recesses 3 by the lower faces of the leads 50 and the resin part 30 at the lower face 81 of the package 1. Thus, the bonding members to be bonded to individual leads can be positioned in the recesses 3 created, thereby reducing the likelihood of the bonding members coming into contact with one another to cause a short circuit. Alternatively, as shown in FIG. 3B, the lower faces of the leads 50 may be positioned lower than the lower face of the resin part 30 at the lower face 81 of the package 1. This exposes the lower faces and portions of the lateral faces of the leads 50 at the lower face 81 of the package 1. As a result, the bonding members can cover the lower faces and the portions of the lateral faces of the leads 50 thereby enhancing the bonding strength of the bonding members.

The outer shape of the package 1 and the shape of the opening of the recess 2 when viewed from the top can be a rectangle or another polygonal shape, circle, ellipse, or the like. Furthermore, the shape of the opening of the recess 2 in a top view, as shown in FIG. 1A, can be partially modified such as by applying a chamfer to a corner. This allows the part of the opening to function as a marking to indicate the polarity of the lead, such as an anode or cathode marking.

Figure 4A:
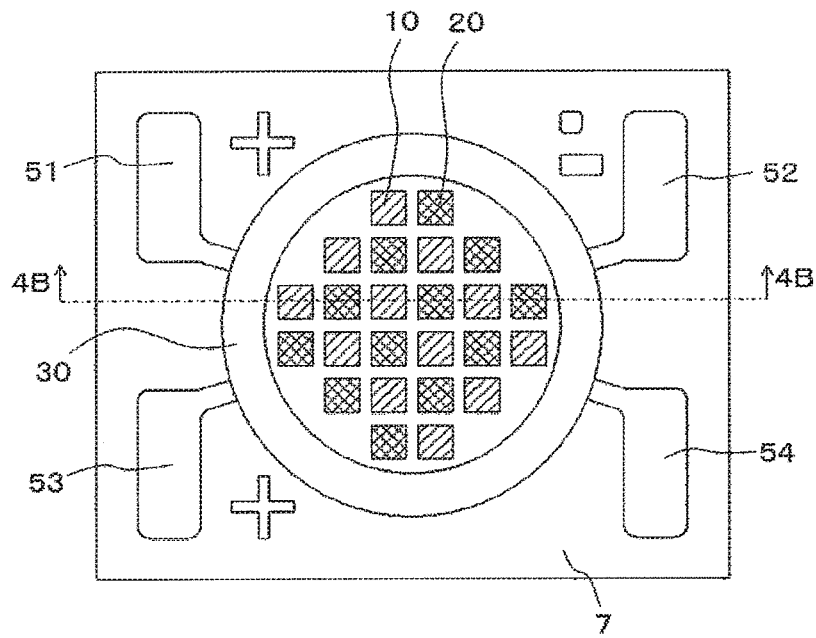
FIG. 4A is a schematic top view showing an example of a package.
Figure 4B:
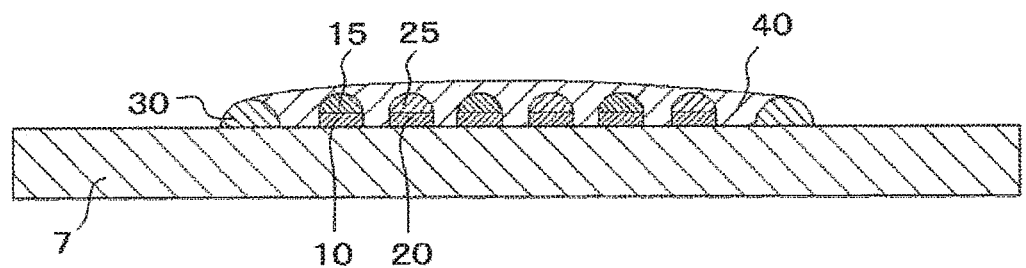
FIG. 4B is a schematic end view taken along the line 4B-4B in FIG. 4A.

As shown in FIG. 4A and FIG. 4B, a package having a sheet-shaped substrate 7 and a frame-shaped resin part 30 formed using a light reflecting resin disposed on the upper face of the substrate 7 can be used as another example of the package 1. FIG. 4A is a schematic top view of the package 1, and FIG. 4B is a schematic end view at line 4B-4B in FIG. 4A. In FIG. 4A, the encapsulant 40, the first light transmissive member 15, and the second light transmissive member 25 are omitted. The frame-shaped resin part 30 plays the role as a reflector to reflect light, and the role as a wall to fill the inside with the encapsulant 40. The substrate 7 has a plurality of leads, for example, the first lead 51, the second lead 52, the third lead 53, and the fourth lead 54. The size of such a package 1 is suitably set in accordance with the number of light emitting elements disposed, the purpose and use. For the material of the substrate 7, an insulating material is preferably used, and a material that does not readily transmit the light exiting from the light emitting elements or the external light is preferably used. Furthermore, in order to improve the light reflection of the package 1, a reflector may be disposed on the light emitting element mounting surface. The reflector, for example, is made by mixing reflecting particles, such as titanium oxide, with an organic or inorganic binder. Examples include a so-called white resist, white ink, ceramic ink, and the like. It is particularly preferable to employ a silicone resin due to its highly heat resistant and highly light resistant for the organic binder. This allows the surface of the substrate 7 to reflect light thereby providing a light emitting device having a high light extraction efficiency.

In the light emitting device shown in FIG. 4A and FIG. 4B, the first light emitting elements 10 and the second light emitting elements 20 are alternately arranged. This allows the light from the first light emitting elements 10 and the second light emitting elements 20 to be fully mixed, thereby reducing color variance of the light emitting device when viewed from the top. However, the layout of the first light emitting elements 10 and the second light emitting elements 20 can be appropriately selected other than this. For example, groups of the first light emitting elements 10 and groups of the second light emitting elements 20 can respectively be arranged in a strip formation along the X direction or the Y direction, or in a concentric circular formation.

The package 1 may be of a format without a recess 2. For example, an elongated substrate may be used for the package 1. Such a package 1, for example, has flexibility. Accordingly, it can be wound onto a reel when stored, and can be installed along a curved surface. For the material of the substrate, for example, an insulating resin, such as polyimide, polyethylene terephthalate, polyethylene naphthalate, or the like can be suitably used. The thickness of the substrate can be set, for example, to about 10 μm to about 200 μm.

A Plurality of Leads

The leads 50 are conductive and function as electrodes to supply power to the light emitting elements. For the base material for the leads 50, for example, metals, such as copper, aluminum, gold, silver, iron, nickel, or their alloys, phosphor bronze, iron-containing copper, or the like can be used. The metal layer may be configured by a single layer or stack structure (e.g., clad material). Cupper is particularly preferable to use for the base material because it is inexpensive and highly exothermic. The leads 50 may have a metal layer on the surface of the base material. Examples of the metal layers include silver, aluminum, nickel, palladium, rhodium, gold, copper, or their alloys. The metal layers may be disposed across the entire surfaces of the leads 50 or may be partially disposed. The metal layers formed on the upper faces of the leads may be different from the metal layers formed on the lower faces of the leads. For example, the metal layers formed on the upper faces of the leads are multiple layers of metals including nickel layer and silver layer. The metal layers formed on the lower faces of the leads do not include a nickel layer. Moreover, the metal layers such as silver formed on the upper faces of the leads, for example, can be thicker than the metal layers such as silver formed on the lower faces of the leads.

In the case in which a metal layer containing silver is formed on the outermost surface of the leads 50, it is preferable to dispose a protective layer such as silicon oxide on the surface of the silver-containing metal layer. This can reduce discoloration of the silver-containing metal layer caused by the sulfur component or the like in the atmosphere. The protective layer can be formed by a vacuum process such as sputtering, but may be formed by other known methods.

The leads 50 include at least a first lead 51, a second lead 52, and a third lead 53. Providing at least three leads as the leads 50 enables independent driving of the multiple light emitting elements. The leads 50 may include four or more leads, for example, a fourth lead in addition to the first lead 51, the second lead 52, and the third lead 53. The fourth lead may function as a heat dissipating member or an electrode in a similar manner to that of the first lead 51 or the like.

Resin Part

Examples of the base material of the resin part 30 include a thermosetting resin, thermoplastic resin, or the like can be used. Specific examples include: a hardened body of an epoxy resin composition, silicone resin composition, modified epoxy resin composition such as silicone modified epoxy resin, modified silicone resin composition such as epoxy modified silicon resin, unsaturated polyester resin, saturated polyester resin, polyimide resin composition, and modified polyimide resin composition; or a resin such as polyphthalamide (PPA), polycarbonate resin, polyphenylene sulfide (PPS), liquid crystal polymer (LCP), ABS resin, phenol resin, acrylic resin, PBT resin, or the like. Particularly, a thermosetting resin such as an epoxy resin composition or modified silicone resin composition is preferably used.

Moreover, a silicone resin composition (e.g., SMC resin) is preferably used for the resin material for the resin part 30 due to its highly heat resistant and highly light resistant.

The resin part 30 preferably contains a light reflecting substance in the resin material that is the base material described above. For the light reflecting substance, it is preferable to employ a material that barely absorbs the light from the light emitting elements, and has a large refractive index difference from that of the base resin material. Examples of such light reflecting substances include titanium oxide, zinc oxide, silicon oxide, zirconium oxide, aluminum oxide, and aluminum nitride.

The resin part 30 may contain a filler having a low reflectance relative to the external light (in many cases, sunlight) in order to improve the contrast of the light emitting device 100. In this case, the resin part 30, for example, is black or a color close to black. For the filler, carbon, such as acetylene black, activated carbon, and graphite, colored organic pigments, transition metal oxides, such as iron oxide, manganese dioxide, cobalt oxide, and molybdenum oxide, or the like can be utilized depending on the purpose.

Figure 5A:
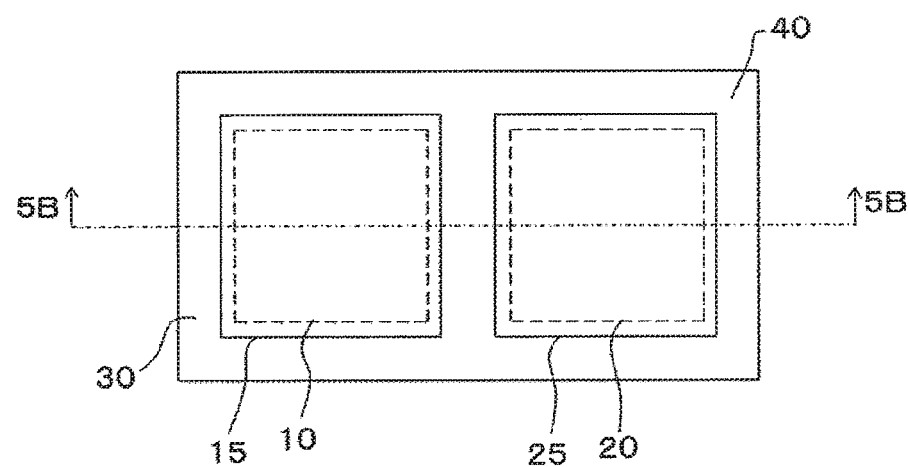
FIG. 5A is a schematic top view showing an example of a light emitting device.
Figure 5B:
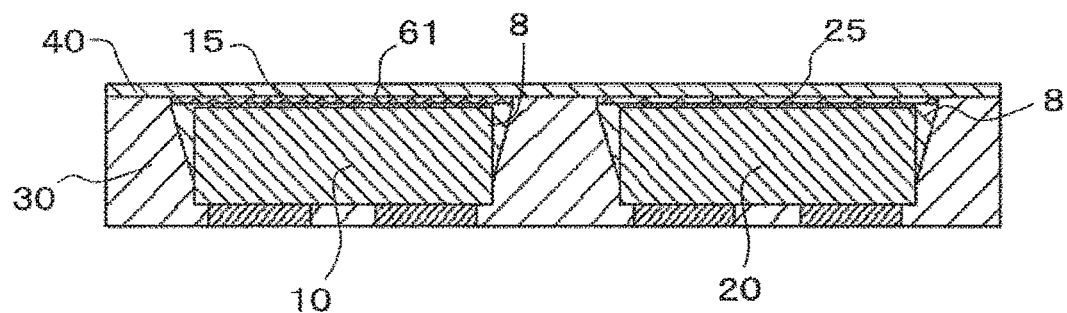
FIG. 5B is a schematic end view at line 5B-5B in FIG. 5A.

The light emitting device according to the present disclosure does not have to include a package 1. FIG. 5A is a schematic top view showing an example of the light emitting device, and FIG. 5B is a schematic end view at line 5B-5B in FIG. 5A. The light emitting device 100A shown in FIG. 5A and FIG. 5B has no package 1. The light emitting device 100A includes a first light emitting element 10, a second light emitting element 20, a first light transmissive member 15 disposed on the upper face of the first light emitting element 10, a second light transmissive member 25 disposed on the upper face of the second light emitting element 20, a light transmissive layer 8 disposed on at least a portion of the lateral faces of the light emitting elements, and a resin part 30 covering the outer face of the light transmissive layer 8. The first light transmissive member 15 contains a first phosphor 61. In the light emitting device 100A shown in FIG. 5B, the light transmissive layer 8 covers the upper faces of the light emitting elements.

The light transmissive layer 8 covers at least a portion of the lateral faces of each light emitting element, and guides the light exiting from the lateral faces of the light emitting elements towards the upper face of the light emitting device. That is, part of the light reaching the lateral faces of the light emitting elements is reflected by the lateral faces and is attenuated in the light emitting elements, but the light can be extracted from the light emitting elements through the light transmissive layer 8. For the light transmissive layer 8, the resin materials listed as examples for the resin part 30 can be used, particularly a light transmissive thermosetting resin such as a silicone resin, silicone modified resin, epoxy resin, phenol resin, or the like is preferable. The light transmissive layer 8 preferably has a high light transmittance. For this reason, it is normally preferable for the light transmissive layer 8 to not contain any additive that reflects, absorbs, or scatters the light.

The resin part 30 covers the outer surfaces of the light transmissive layer 8 disposed on the lateral faces of each light emitting element, and portions of the lateral faces of each light emitting element. The resin material of the resin part 30 is selected so that the thermal expansion coefficient difference between the light transmissive layer 8 and each of the light emitting element (this is referred to as "a first thermal expansion coefficient difference ΔT30"), and the thermal expansion coefficient difference between the resin part 30 and each of the light emitting elements. (this is referred to as "a second thermal expansion coefficient difference ΔT40) satisfy, for example, the relationship ΔT40<ΔT30. This can reduce the likelihood of the light transmissive layer 8 separating from each light emitting element.

Figure 5C:
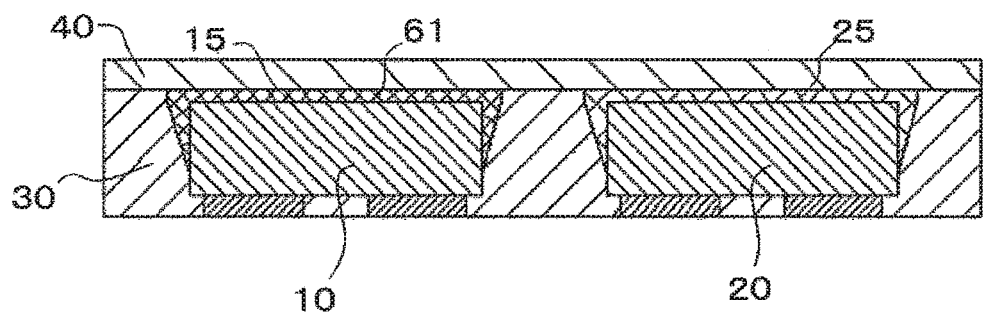
FIG. 5C is a variation of the light emitting device according to the first embodiment.

The light emitting device 100B shown in FIG. 5C is a variation of the light emitting device 100A. In the light emitting device 100B, the light transmissive layer described earlier corresponds to the first light transmissive member 15 and the second light transmissive member 25. That is, the first phosphor 61 may be contained in the light transmissive layer described earlier. This can reduce the number of parts as compared to the light emitting device 100A, thereby producing an inexpensive light emitting device. For the encapsulant 40 in the light emitting device 100B, a sheet-shaped phosphor can be used. For the sheet-shaped phosphor, for example, a sintered body of a phosphor, or a phosphor-containing glass or ceramic can be used. In this way, the light emitting device 100B can be utilized, for example, as a high output light emitting device.

First Light Emitting Element and Second Light Emitting Element

The first light emitting element 10 and the second light emitting element 20 function as the light sources for the light emitting device 100 as well as the excitation sources for a phosphor. For the first light emitting element 10 and the second light emitting element 20, light emitting diodes or the like can be used, and can include nitride semiconductors that can emit light in the visible region ($In_xAl_yGa_{1-x-y}N$, $0≤x$, $0≤y$, $x+y≤1$).

The peak emission wavelength of each of the first light emitting element 10 and the second light emitting element 20 is 430 nm to 480 nm. Employing the first light emitting element 10 and the second light emitting element 20 each having a longer peak emission wavelength than the near-ultraviolet spectral region can reduce issues associated with light in the near-ultraviolet region, such as adverse effects on the human body or irradiated objects, and deterioration of components, which can considerably reduce the emission efficiency of the light emitting device. The light emitting device 100 can simply include at least two light emitting elements, and may include three or more light emitting elements.

First Light Transmissive Member and Second Light Transmissive Member

The first light transmissive member 15 is located on the upper face of the first light emitting element 10 and the second light transmissive member 25 is located on the upper face of the second light emitting element 20. The first light transmissive member 15 contains a first phosphor 61. The first light transmissive member 15 and the like may be disposed in direct contact with the upper faces of the light emitting elements, or positioned above the light emitting elements while interposing another member (e.g., the protective layer described earlier) between the first light transmissive member 15 and the like and the upper faces of the light emitting elements.

Figure 6:
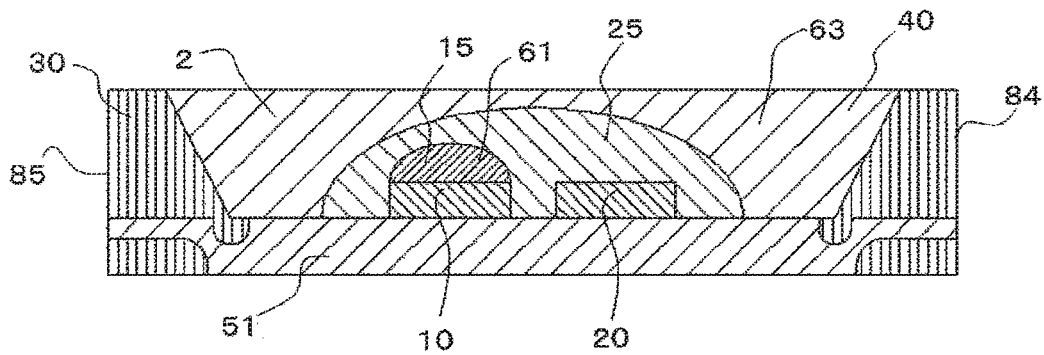
FIG. 6 is a variation of the light emitting device according to the first embodiment.

The first light transmissive member 15 and the second light transmissive member 25 can further cover at least a portion of the lateral faces of the light emitting elements. Covering the upper faces and the lateral faces of the light emitting elements with the first light transmissive member 15 and the like can attenuate color variance between the light emitted upwards and the light emitted laterally from the light emitting elements. The upper faces and the lateral faces of the light emitting elements can be covered by both or only one of the first light transmissive member 15 and the second light transmissive member 25. In FIG. 6, the first light transmissive member 15 is disposed on the upper face of the first light emitting element 10, but does not cover the lateral faces of the first light emitting element 10. The second light transmissive member 25 covers the upper face and the lateral faces of the second light emitting element 20, and further covers the lateral faces of the first light emitting element 10 as well as the first light transmissive member 15. In this way, the light emitted from the first light emitting element 10 and the second light emitting element 20 can be fully mixed, and thus, for example, color variance can be attenuated when the light emitting device 100B is viewed from the top.

The first light transmissive member 15 and the second light transmissive member 25 can have various shapes. Particularly, the first light transmissive member 15 and the second light transmissive member 25, as shown in FIG. 1G, preferably have a substantially hemispherical or substantially elliptical shape. In other words, the first light transmissive member 15 and the second light transmissive member 25 preferably have upper faces that are entirely curved faces. This allows the light emitted from the first light emitting element 10 and the like to be reflected by the surfaces of the first light transmissive member 15 and the like to thereby reduce the light returning towards the first light emitting element 10 and the like.

The first light transmissive member 15 and the second light transmissive member 25 may have the same height or different heights in the direction of height. For example, in the direction of height, the first light transmissive member 15 can be formed higher than the second light transmissive member 25. This can increase, for example, the amount of the first phosphor 61 contained in the first light transmissive member 15. This can easily make the chromaticity of the light exiting from the first light transmissive member 15 different from the chromaticity of the light exiting from the second light transmissive member 25.

For the resin materials comprising the base materials for the first light transmissive member 15 and the second light transmissive member 25, a thermosetting resin, thermoplastic resin, or the like can be used. For the resin materials comprising the base materials, any of those resin materials employable as the base material for the resin part 30 can be used. It is particularly preferable to use a silicone resin composition or epoxy resin composition. Moreover, light scattering particles, such as titanium oxide, silicon oxide, zirconium oxide, aluminum oxide, or the like can be dispersed in the first light transmissive member 15 and the second light transmissive member 25. Furthermore, the resin material comprising the base material of the first light transmissive member 15 may have a different refractive index from that of the resin material comprising the base material of the second light transmissive member 25.

The first phosphor 61 can simply be a phosphor that can be excited by the light from the first light emitting element 10. For example, phosphors, such as $(Ca,Sr,Ba)_5(PO_4)_3(Cl,Br):Eu$, $(Sr,Ca,Ba)_4Al_{14}O_{25}:Eu$, $(Ca,Sr,Ba)_8MgSi_4O_{16}(F,Cl,Br)_2:Eu$, $(Y,Lu,Gd)_3(Al,Ga)_5O_{12}:Ce$, $(Sr,Ca)AlSiN_3:Eu$, $3.5MgO0.5MgF_2GeO_2:Mn$, $(x-s)MgO(s/2)Sc_2O_3yMgF_2uCaF_2(1-t)GeO_2(t/2)M'_2O_3:zMn$, $Ca_3Sc_2Si_3O_{12}:Ce$, $CaSc_2O_4:Ce$, $(La,Y)_3Si_6N_{11}:Ce$, $(Ca,Sr,Ba)_3Si_6O_9N_4:Eu$, $(Ca,Sr,Ba)_3Si_6O_{12}N_2:Eu$, $(Ba,Sr,Ca)Si_2O_2N_2:Eu$, $(Ca,Sr,Ba)_2Si_5N_8:Eu$, $(Ca,Sr,Ba)S:Eu$, $(Ba,Sr,Ca)Ga_2S_4:Eu$, or $K_2(Si,Ti,Ge)F_6:Mn$ can be used.

The first light transmissive member 15 or the second light transmissive member 25 may be formed using a ceramic, glass, or sintered body of a phosphor other than a resin material. This can improve the reliability of the light emitting device even in the case of a high output light emitting device.

Encapsulant

The light emitting device 100 includes a encapsulant 40 that covers the first light transmissive member 15 and the second light transmissive member 25. The encapsulant 40 can protect the light emitting elements and the like from dust, moisture, and the like. The encapsulant 40 preferably transmits at least 60% of the light emitted from the light emitting elements, more preferably at least 90%. For the base material for the encapsulant 40, the resin material used for the resin part 30 can be used. For the base material for the encapsulant 40, a thermosetting resin, thermoplastic resin, or the like can be used, for example, a silicone resin, epoxy resin, acrylic resin, or a resin including at least one of these resins can be used. The encapsulant may be formed of a single layer or constructed with multiple layers. Moreover, light scattering particles, such as titanium oxide, silicon oxide, zirconium oxide, aluminum oxide, or the like can be dispersed in the encapsulant 40.

The encapsulant 40 contains a second phosphor 63 that converts the wavelengths of the light from the light emitting elements. The second phosphor 63 may be of one type or multiple types of phosphors. By using multiple types of phosphors for the second phosphor 63, the color rendering properties and the like of the light emitting device 100 can be improved. For the second phosphor 63, the phosphor used for the first phosphor 61 can be used. A phosphor having large full width at half maximum is preferably used for the second phosphor 63, for example, $(Y,Lu,Gd)_3(Al,Ga)_5O_{12}:Ce$, more preferably a mixture of $(Y,Lu,Gd)_3(Al,Ga)_5O_{12}:Ce$ and $(Sr,Ca)AlSiN_3:Eu$. This can produce a light emitting device having good color rendering properties. Furthermore, for the second phosphor 63, a phosphor emitting light having a wavelength that is equivalent to or shorter than that of the first phosphor 61 is preferable. This can reduce the percentage of the light emitted from the first phosphor 61 that is absorbed by the second phosphor 63.

The light scattering particle and/or phosphor content, for example, is preferably about 10 to 150 wt % relative to the total weight of the encapsulant 40.

The encapsulant 40 may be formed with a ceramic, glass, sintered body of a phosphor, or the like besides a resin material. This can improve the reliability of the light emitting device even in the case of a high output light emitting device. Moreover, in the case of a high output light emitting device, the first light transmissive member 15, the second light transmissive member 25, and the encapsulant 40 can be formed with a ceramic, glass, sintered body of a phosphor, or the like.

Protection Device

The light emitting device 100 can include a protection device for increasing the electrostatic voltage resistant. In the light emitting device 100 shown in FIG. 1A, the protection device 11 is located on the upper face of the second lead 52. One or multiple protection devices may be used. For example, in the light emitting device 100, a protection device may be disposed for each light emitting element. In the light emitting device 100, separate conduction paths are provided for the light emitting elements. Accordingly, disposing a protection device for each light emitting element can increase the electrostatic voltage resistant of the light emitting device 100.

Second Embodiment

Figure 7A:
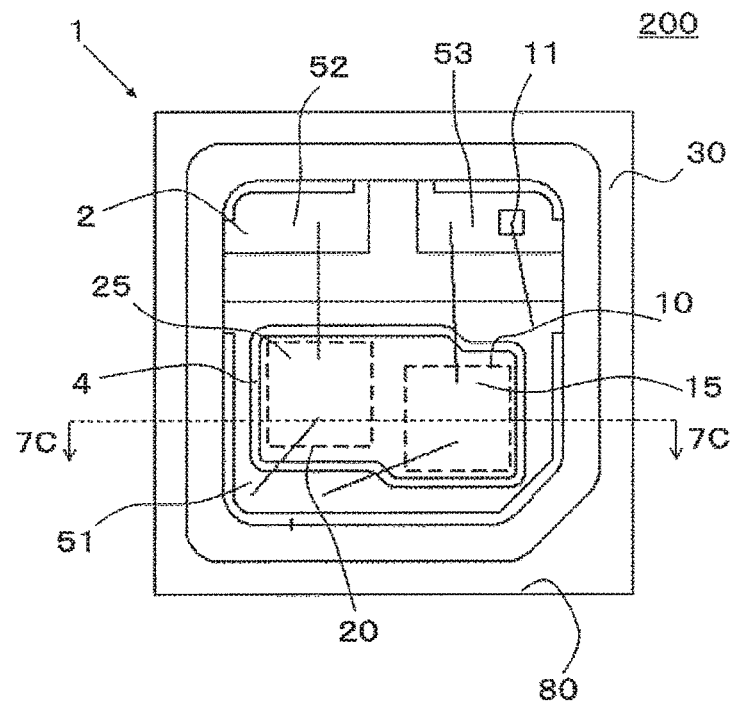
FIG. 7A is a schematic top view of the light emitting device according to a second embodiment.
Figure 7B:
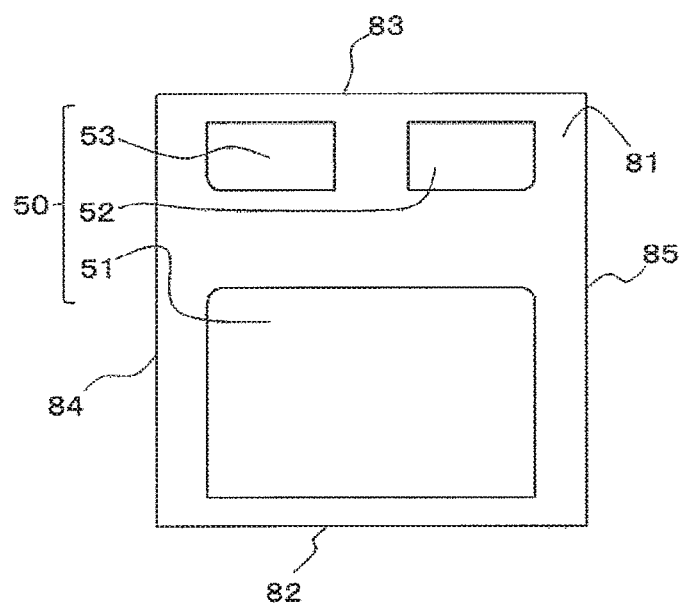
FIG. 7B is a schematic bottom view of the light emitting device according to the second embodiment.
Figure 7C:
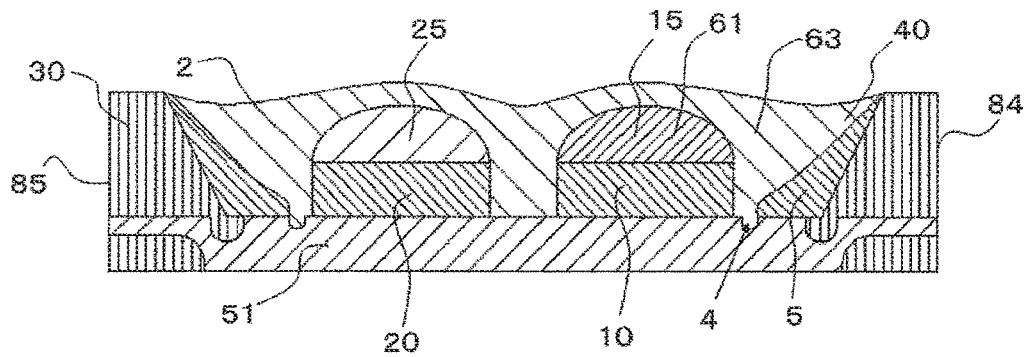
FIG. 7C is a schematic end view taken along the line 7C-7C in FIG. 7A.

FIG. 7A is a schematic top view of the light emitting device 200 according to a second embodiment, FIG. 7B is a schematic bottom view of the light emitting device 200, and FIG. 7C is a schematic end view at line 7C-7C in FIG. 7A. In FIG. 7A, the encapsulant 40 and the light reflecting member 5 are omitted so that the interior of the recess 2 can be easily understood. The light emitting device 200 primarily differs from the light emitting device 100 according to the first embodiment in inclusion of a groove 4 that surrounds the area where the light emitting elements are mounted, and a light reflecting member 5. Accordingly, the light emitting device 200 will be explained by focusing on the groove 4 and the light reflecting member 5.

As shown in FIG. 7A, the light emitting device 200 has a groove 4 surrounding the element mounting area. The groove 4 functions as a dam for damming up the resin material that forms the light reflecting member 5, described later. The groove 4 is disposed between the outer peripheral area (the area where the light reflecting member 5 will be formed) and the element mounting area at the bottom face of the recess 2.

The groove 4 may be one continuous groove, or constructed with multiple intermittently formed grooves. In the case in which the groove 4 is constructed with multiple intermittently formed grooves, the inter-groove distance is preferably set narrow. This can alleviate that the resin material to be the light reflecting member 5 reaches the lateral faces of the light emitting elements. The inter-groove distance, for example, is 1 μm to 100 μm, preferably 10 μm to 50 μm.

The light reflecting member 5 has a light reflecting surface in the recess 2, and has the function of efficiently extracting the light from the first light emitting element 10, the second light emitting element 20, and the like in the upward direction. The light reflecting surface of the light reflecting member 5 is located between the inner lateral surfaces of the recess 2 and the groove 4. The light emitting device 200 including a light reflecting member 5 can improve extraction of light from the light emitting device.

The light reflecting member 5 is preferably a member that hardly transmits or absorbs the light from light emitting elements and external light. The light reflecting member 5 is preferably white. For the resin material comprising the base material for the light reflecting member 5, a thermosetting resin, thermoplastic resin, or the like can be used. Specifically, a phenol resin, epoxy resin, BT resin, PPA, silicone resin, or the like can be used. The light reflecting member 5 contains a light reflecting substance in the resin material comprising the base material. For the light reflecting substance, it is preferable to use a material that hardly absorbs the light from the light emitting elements as well as having a large refractive index difference from the resin material comprising the base material. Examples of such a light reflecting substance include titanium oxide, zinc oxide, silicon oxide, zirconium oxide, aluminum oxide, and aluminum nitride. The viscosity of the light reflecting member 5 in the uncured state is preferably lower than the viscosity of the resin part 30 in the uncured state. This facilitates the flow of the light reflecting member 5 in the recess 2, thereby reducing the likelihood of insufficient filling of the light reflecting member 5. The viscosity of the light reflecting member 5 in the uncured state is preferably 1 pa·s to 20 pa·s, more preferably 5 pa·s to 15 pa·s. The light reflecting member 5, moreover, is preferably highly thixotropic in the uncured state.

The light reflecting member 5 preferably has a higher light reflectance than the resin part 30. For example, the amount of the light reflecting substance (e.g., titanium oxide) contained in the light reflecting member 5 is greater than the amount of light reflecting substance (e.g., titanium oxide) contained in the resin part 30. Specifically, the amount of the light reflecting substance contained in the light reflecting member 5 is preferably at least 1.5 times, more preferably at least two times, even more preferably at least 2.5 times the amount of the light reflecting substance contained in the resin part 30. For example, 30 to 75 wt % of titanium oxide relative to the total weight of the uncured resin material is contained in the light reflecting member 5, and 15 to 20 wt % of titanium oxide relative to the total weight of the uncured resin material is contained in the resin part 30.

Third Embodiment

Figure 8A:
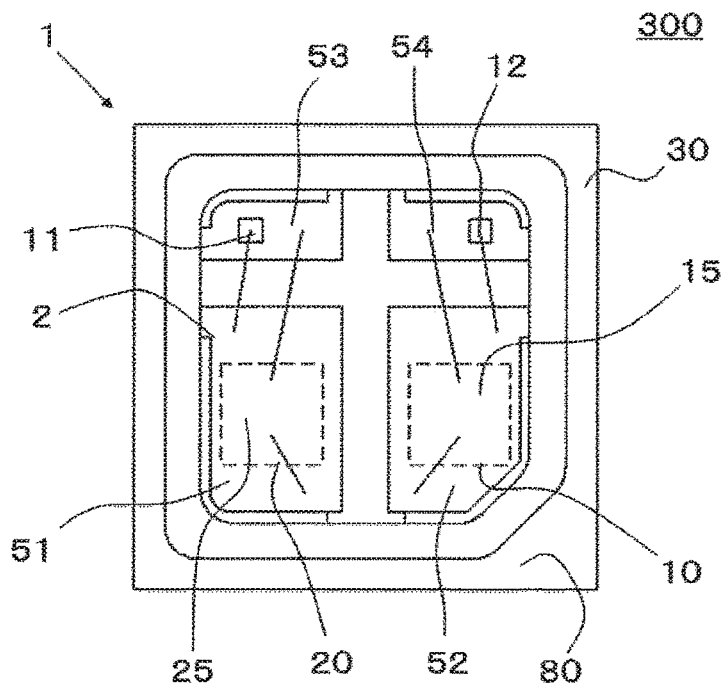
FIG. 8A is a schematic top view of the light emitting device according to a third embodiment.
Figure 8B:
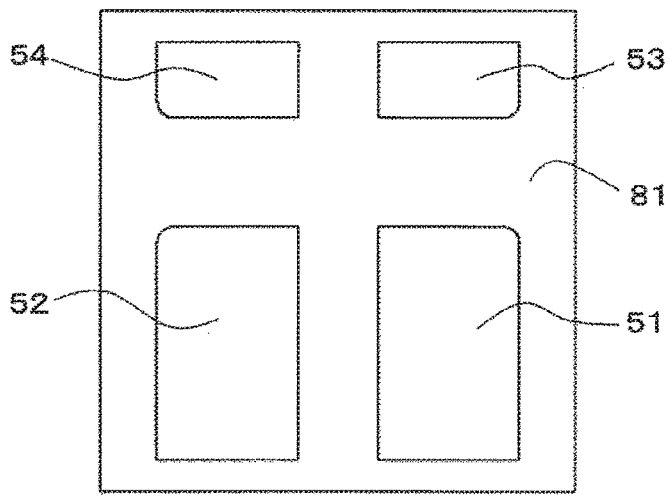
FIG. 8B is a schematic bottom view of the light emitting device according to the third embodiment.

FIG. 8A is a schematic top view of the light emitting device 300 according to a third embodiment, and FIG. 8B is a schematic bottom view of the light emitting device 300. The light emitting device 300 primarily differs from the light emitting device 100 according to the first embodiment in further including a fourth lead 54. Accordingly, the light emitting device 300 will be explained by focusing on the difference from the light emitting device 100.

The light emitting device 300 further includes a fourth lead 54 as one of the leads 50. In the light emitting device 300 shown in FIG. 8A, the first light emitting element 10 is disposed on the upper face of the first lead 51, the second light emitting element 20 is disposed on the upper face of the second lead 52. One of the positive and negative electrodes of the first light emitting element 10 is connected to the first lead 51 using a wire, and the other electrode is connected to the third lead 53 using a wire. One of the positive and negative electrodes of the second light emitting element 20 is connected to the second lead 52 using a wire, and the other electrode is connected to the fourth lead 54 using a wire. This can completely separate the conduction path of the first light emitting element 10 (first lead 51 and third lead 53) from the conduction path of the second light emitting element 20 (second lead 52 and fourth lead 54). This enables highly flexible adjustment of the values of the electric current supplied to each of the first light emitting element 10 and the second light emitting element 20.

The light emitting device 300 includes a plurality of protection devices. The light emitting device 300 shown in FIG. 8A includes a first protection device 11 and a second protection device 12. The first protection device 11 is disposed on the upper face of the third lead 53, and the second protection device 12 is disposed on the upper face of the fourth lead 54. In the light emitting device 300, because the conduction path of the first light emitting element 10 and the conduction path of the second light emitting element 20 are independent, disposing a protection device for each light emitting element can further increase the electrostatic voltage resistant for the light emitting device 300.

Figure 8C:
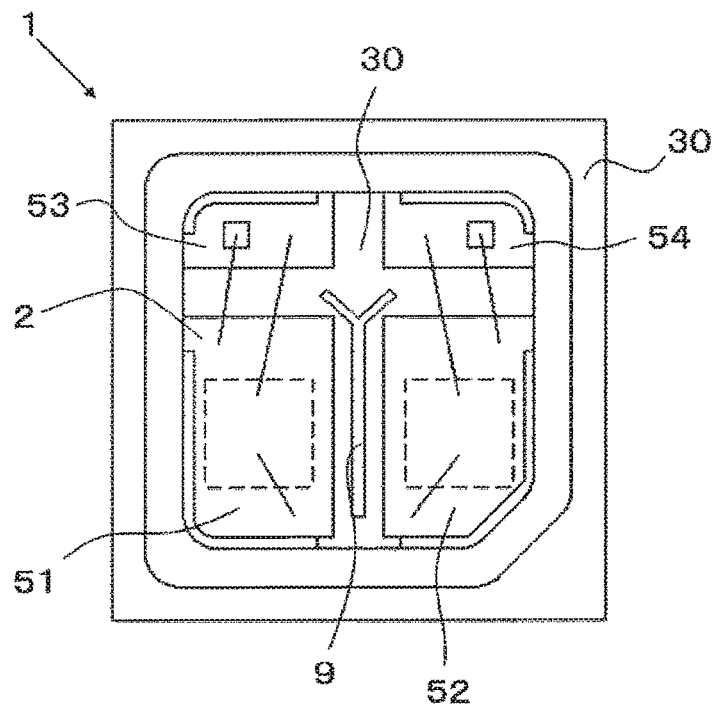
FIG. 8C is a variation of the light emitting device according to the third embodiment.

As shown in FIG. 8C, moreover, the light emitting device 300 preferably has a recess 9 on the upper face of the resin part 30 located at the bottom face of the recess 2. The light emitting device 300 having the recess 9 can improve the adhesion between the resin part 30 and the encapsulant 40.

The recess 9 can have various shapes, and can be formed, for example, between the first lead 51 and the second lead 52, between the first lead 51 and the third lead 53, between the second lead 52 and the fourth lead 54, or between the third lead 53 and the fourth lead 54 when viewed from the top. Furthermore, the recess 9 can be formed continuously in these regions. In FIG. 8C, the recess 9 is continuously formed between the first lead 51 and the second lead 52, between the first lead 51 and the third lead 53, and between the second lead 52 and the fourth lead 54 when viewed from the top.

Figure 8D:
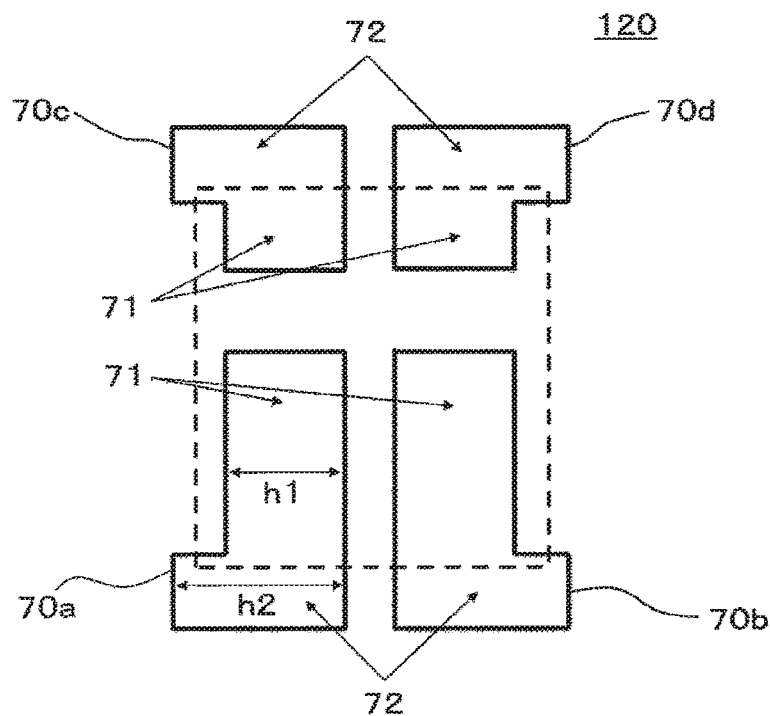
FIG. 8D is a schematic top view showing the wiring of a mounting substrate.

FIG. 8D is a schematic top view of the wiring 120 of the mounting substrate on which the light emitting device 300 is to be mounted. The portion indicated by the broken lines in the figure are the outer edges of the light emitting device 300. The wiring 120 of the mounting substrate shown in FIG. 8D has a first wiring part 70a, a second wiring part 70b, a third wiring part 70c, and a fourth wiring part 70d. Furthermore, the first wiring part 70a and the like each have a narrow part 71 having a first width h1 and a wide part 72 having a second width h2. The leads 50 located on the lower face of the light emitting device 300 are electrically connected to the wiring 120 of the mounting substrate via bonding members. Specifically, the first lead 51 is positioned on the narrow part 71 of the first wiring part 70a, the second lead 52 is positioned on the narrow part 71 of the second wiring part 70b, the third lead 53 is positioned on the narrow part 71 of the third wiring part 70c, and the fourth lead 54 is positioned on the narrow part 71 of the fourth wiring part 70d. By matching the width of the lead positioned on each narrow part 71 to the first width h1 of the narrow part 71, the self-alignment of the light emitting device 300 can be further improved. Disposing the light emitting device 300 so that the outer edges of the light emitting device 300 are positioned on the wide parts 72 of the wiring parts allows self-alignment to work at the outer edges of the wide parts 72 in the case in which the light emitting device 300 is rotated. As a result, the self-alignment of the light emitting device 300 can be further improved.

Figure 8E:
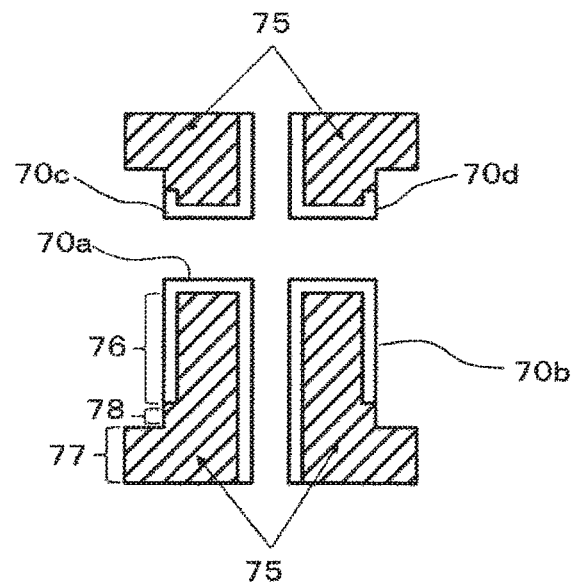
FIG. 8E is a schematic top view showing the openings of a mask.

Subsequently, FIG. 8E shows the state in which bonding members are formed on the wiring 120 of the mounting substrate. The bonding members on the wiring 120 of the mounting substrate can be formed, for example, by using a mask having openings 75 and disposing a bonding material in the openings. The thickness of the mask, for example, is 50 μm to 200 μm, preferably 75 μm to 150 μm, more preferably 90 μm to 120 μm. In this way, appropriate amount of bonding material can be disposed on the wiring, which can reduce the likelihood of, for example, allowing bonding material to be excessively disposed to thereby slanting the light emitting device when mounted or hindering self-alignment of the light emitting device 300. In FIG. 8E, the hatched regions are the mask openings 75 where bonding members are to be formed. The outer edges of the mask openings 75 may coincide with the outer edges of the wiring parts, but do not have to coincide with the outer edges of the wiring parts, when viewed from the top. Some of the outer edges of the openings 75 shown in FIG. 8E coincide with the outer edges of the wiring parts, and the other outer edges are positioned on the inner side than the outer edges of the wiring parts. Specifically, when viewed from the top, the openings 75 are disposed so that the distance between two adjacent openings 75 is larger than the distance between two corresponding wiring parts. This can reduce the likelihood of a bonding member spreading astride each wiring part, resulting in a short circuit, when the bonding member is melted. This facilitates the spreading of the bonding member in each wiring part while reducing the amount of the bonding member. Furthermore, each opening 75, as shown in FIG. 8E, preferably has a narrow part 76, a wide part 77, and an intermediate part 78 that is located between the narrow part 76 and the wide part 77. The width of the intermediate part 78 (i.e., width from the right to left in the figure) is wider than the width of the narrow part 76, but narrower than the width of the wide part 77. An opening 75 having an intermediate part 78 can facilitate spreading of a bonding member in the opening 75.

The total surface area of the mask openings is preferably at least 30%, more preferably at least 40%, even more preferably at least 50% of the total surface area of the wiring parts of the mounting substrate. This can reduce the likelihood of a bonding strength decline between the light emitting device 300 and the mounting substrate attributable to an insufficient amount of bonding material. Furthermore, the total surface area of the mask openings 75 is preferably smaller than 100% of the total surface area of the wiring parts of the mounting substrate. This can reduce the likelihood of a bonding member spreading astride each wiring part, resulting in a short circuit, when the bonding member is melted.

Figure 8F:
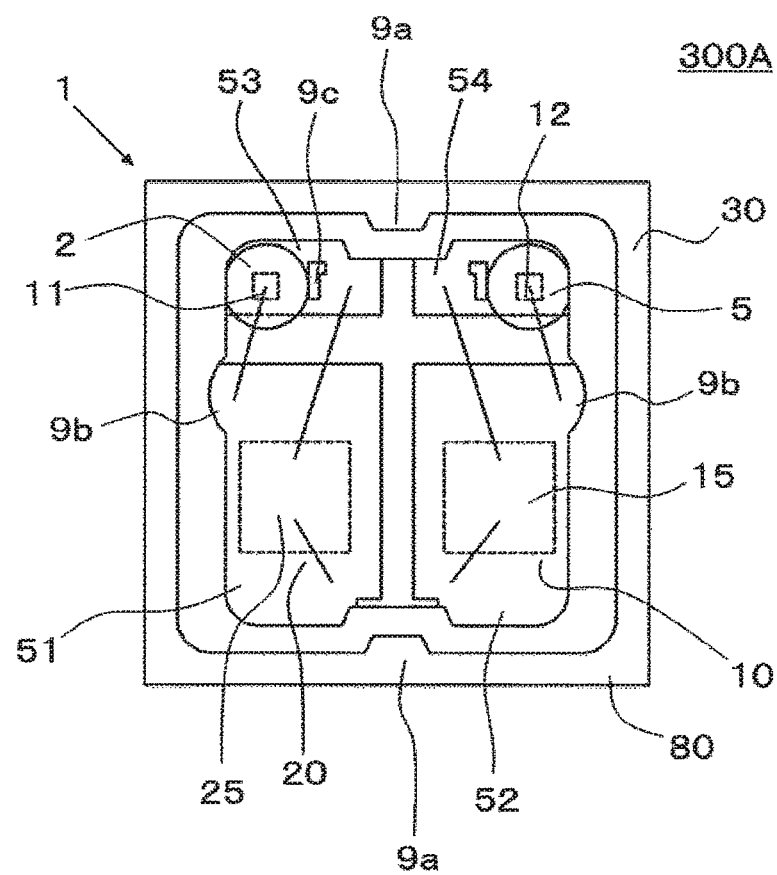
FIG. 8F is a schematic top view showing a variation of the light emitting device according to the third embodiment.

Subsequently, FIG. 8F shows a light emitting device 300A, which is a variation of the light emitting device 300. The light emitting device 300A has a projection 9a at a location of the lateral walls of the recess 2. The projection 9a has the shape that projects in the direction from the outer side to the inner side of the package 1. The projection 9a is preferably formed astride at least two of the leads 50. This enhances the strength of the area between at least two leads, thereby increasing the strength of the package 1. In the light emitting device 300A shown in FIG. 8F, the projections 9a are formed spanning from the first lead 51 to the second lead 52, and spanning from the third lead 53 to the fourth lead 54. This can enhance the strength of the package 1. Furthermore, when the spaces between leads extend linearly from one lateral wall to the opposing lateral wall of the recess 2 as in the case of the light emitting device 300A, the package 1 might occasionally have low strength. In the case of such a light emitting device 300A, providing projections 9a linearly in the spaces between leads can attenuate the decline of the strength of the package 1. In the light emitting device 300A, the projections 9a are formed linearly in the spaces between the leads (the space between first lead 51 and second lead 52, and the space between the third lead 53 and the fourth lead 54). This can effectively enhance the strength of the package 1.

The light emitting device 300A preferably has first recesses 9b on the lateral walls of the recess 2. The light emitting device 300A having the first recesses 9b can increase the adhesion strength with the encapsulant 40. Moreover, connecting ends of the wires for the light emitting elements and the protection devices to the vicinity of the first recesses 9b can ensure large wire connection areas, thereby reducing the likelihood of a wire connection failure. In the light emitting device 300A shown in FIG. 8F, one end of the wires respectively connecting to the first protection device 11 and the second protection device 12 is connected in the vicinity of the first recesses 9b.

The light emitting device 300A preferably includes a light reflecting member 5 that covers the protection devices. This can reduce the likelihood of absorption of the light from the light emitting elements by the protection devices.

The light emitting device 300A preferably has second recesses 9c on the upper face of the leads in the vicinity of the protection devices. On the upper face of one lead, the second recess 9C is preferably positioned between the area where one end of the wire is connected to the light emitting element and the protection device. Accordingly, the bonding member that bonds the protective element is less likely to spread to the area where one end of the wire is connected to the light emitting element, as well as reducing the likelihood of a wire connection failure or the like. The second recesses 9c may have a linear shape, curved shape, or combination of linear and curved shapes when viewed from top. The second recesses 9c, for example, can have a bent shape when viewed from the top as shown in FIG. 8F. The bent shape, for example, is L shaped. This can provide large contact areas for the second recesses 9c with the bonding members and the like in the case in which the bonding members bonding the protection devices or the light reflecting member 5 described earlier flow towards the areas where ends of the wires for the light emitting elements are connected. This can reduce the likelihood of a connection failure of the wires of the light emitting elements, thereby producing a highly reliable light emitting device.

Figure 8G:
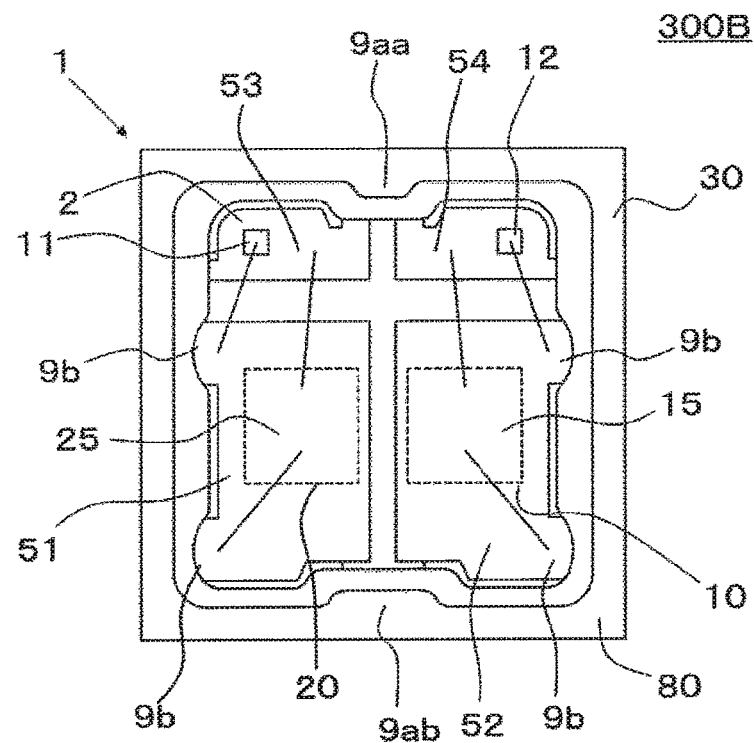
FIG. 8G is a schematic top view showing a variation of the light emitting device according to the third embodiment.

FIG. 8G shows a light emitting device 300B as a variation of the light emitting device 300A. The light emitting device 300B has a first projection 9aa on a portion of the lateral wall of the recess 2, a second projection 9ab having a different width from the first projection 9aa when viewed from the top. The first projection 9aa and the second projection 9ab have different shapes from each other, thereby functioning as marks indicating the polarities of the leads in the light emitting device 300B. In the light emitting device 300B shown in FIG. 8G, the first projection 9aa and the second projection 9ab are formed from the lower face toward the upper face 80 of the resin package 1. The first projection 9aa and the second projection 9ab are configured as a portion of the resin part 30.

Figure 8H:
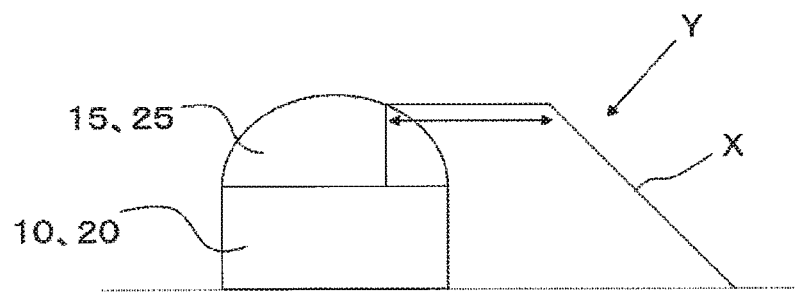
FIG. 8H is an illustration schematically showing a shape of wire in connection with the light emitting element.

The light emitting device 300B includes the first recess 9b on the lateral wall of the recess 2. The first recesses 9b are positioned in the vicinities of the ends at one side of the wires for protection device and in the vicinities of the ends at one side of the wires for the light emitting elements. The light emitting device 300B having the first recesses 9b can increase the adhesion strength with the encapsulant 40. Moreover, ends of the wires for the light emitting elements and ends of the wires for the protection devices are connected to the vicinity of the first recesses 9b, thus large wire connection areas can be secured. Specifically, as shown in FIG. 8H, in the case in which portions of the wires Y for the light emitting elements 10 and 20 are positioned in the light transmissive members 15 and 25, the distance between the light transmissive members 15, 25 and the inclined portion X of the wires Y (i.e., part of the wires between the bent portion and the portion where the wire Y is connected to the lead, in FIG. 8H) can be readily increased. Accordingly, for example, the resin material is less likely to run along the wires Y when resin material for the light transmissive member is applied on or above the light emitting elements, thereby allowing the light transmissive member to be desired shape. In the light emitting device 300B shown in FIG. 8G, ends of the wires for respectively connecting the first light emitting element 10, the second light emitting element 20, the first protection device 11, and the second protection device 12 are connected in the vicinity of either one of the first recesses 9b.

Figure 8I:
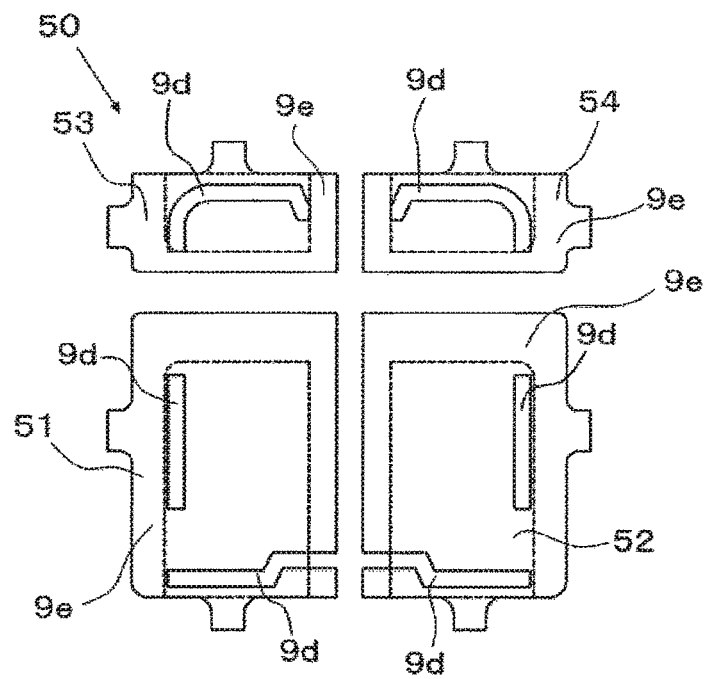
FIG. 8I is a schematic top view showing a plurality of leads.
Figure 8J:
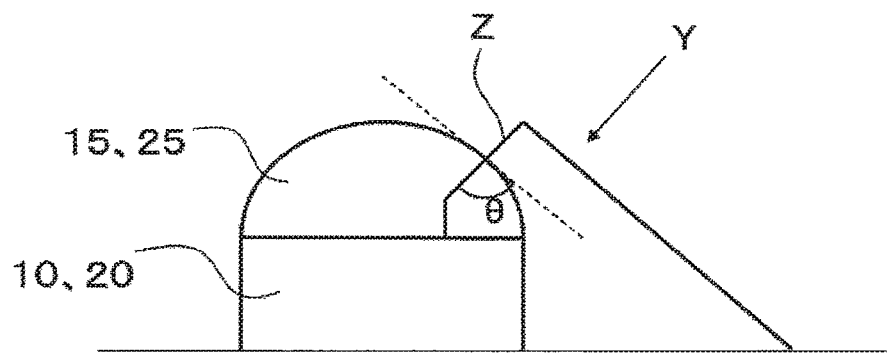
FIG. 8J is a diagram schematically showing a shape of wire in connection with the light emitting element.
Figure 8K:
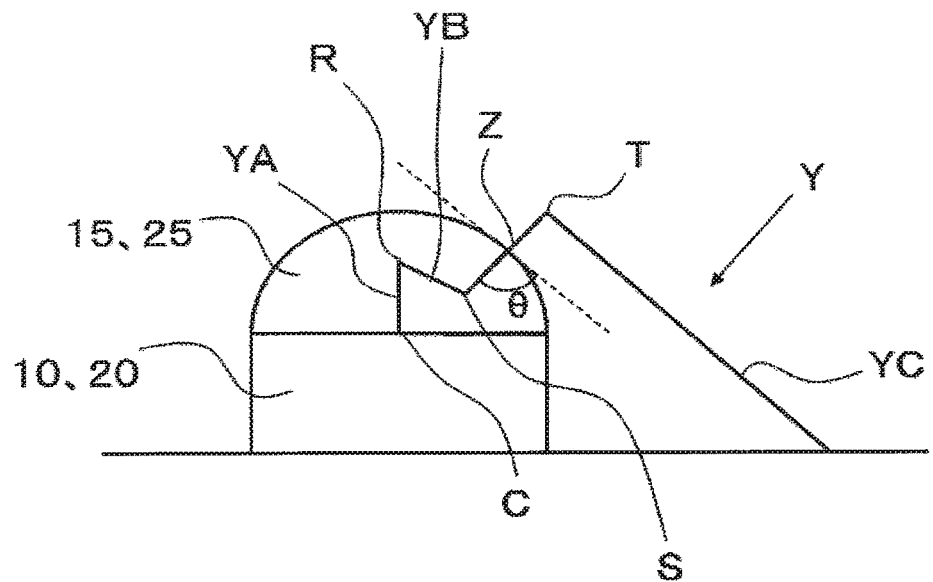
FIG. 8K is a diagram schematically showing a shape of wire in connection with the light emitting element.

FIGS. 8J and 8K show other shapes of the wires Y. The wire Y shown in FIG. 8J has a linear portion Z extending out from inside of the light transmissive member 15, 25 to the outside thereof. The linear portion Z is formed such that the angle θ defined by the linear portion Z and the tangent line of the upper face of the light transmissive member 15, 25 is 90°±15°. Accordingly, for example, the resin material is less likely to run along the wires Y when resin material for the light transmissive member 15, 25 is applied on or above the light emitting elements, thereby allowing the light transmissive member to be desired shape. The connection portion C between the electrode of the light emitting element and the wire Y can be changed depending on the position of the electrode of the light emitting element or the electrode shape. In such a case, as shown in FIG. 8K, a plurality of bent portions can be formed between the connection portion C and the linear portion Z to adjust the starting point and the end point of the linear portion Z. This allows the angle θ defined by the linear portion Z and the light transmissive member to be desired angle. In FIG. 8K, the wire Y has three bent portions R, S, T, a first wire portion YA upwardly extending from the connection portion C to the bent portion R, a second wire portion YB extending from the bent portion R to the bent portion S, the linear portion Z extending from the bent portion S to the bent portion T, a third wire portion YC extending from the bent portion T to the upper face of the lead. The bent portion S in the height direction is positioned lower than the bent portion R and the bent portion T. This can facilitate forming the wire Y to be loop shape, thereby improving the resistant.

FIG. 8I is a schematic top view showing the plurality of leads 50 of the light emitting device 300B. The light emitting device 300B includes the plurality of leads 50. The leads 50 shown in FIG. 8I are made up of the first lead 51, the second lead 52, the third lead 53, and the fourth lead 54. The leads 50 preferably include third recesses 9d of which a portion of the resin part 30 is to enter on the upper face. This can improve adhesion between the leads 50 and the resin part 30. The third recesses 9d can be formed on every upper face of the leads or on one or some of the upper face(s) of the leads. The number of the third recesses 9d can be one or more on one upper face of the leads. Among the leads 50 shown in FIG. 8I, the plurality of third recesses 9d are formed on each of the upper face of the first lead 51 and the upper face of the second lead 52. The third recesses 9d are not formed on or near the area where the first recesses 9b in FIG. 8G are positioned on the upper face of the first lead 51 and the upper face of the second lead 52.

The area enclosed by the broken line in FIG. 8I shows an area where the leads 50 are exposed from the resin part 30 on the lower face of the light emitting device 300B. The leads 50 in FIG. 8I have lower-face recesses 9e on the lower face. The leads 50 having the lower-face recesses 9e allow a part of the resin part 30 to enter into the lower-face recesses 9e, thereby improving the adhesion between the leads 50 and the resin part 30. It is preferable that the third recesses 9d are not positioned above the lower-face recesses 9e. This can alleviate that the third recess 9d and the lower-face recess 9e are linked with each other, or that the third recess 9d penetrate to the lower-face recess 9e, or vice versa.

Figure 9A:
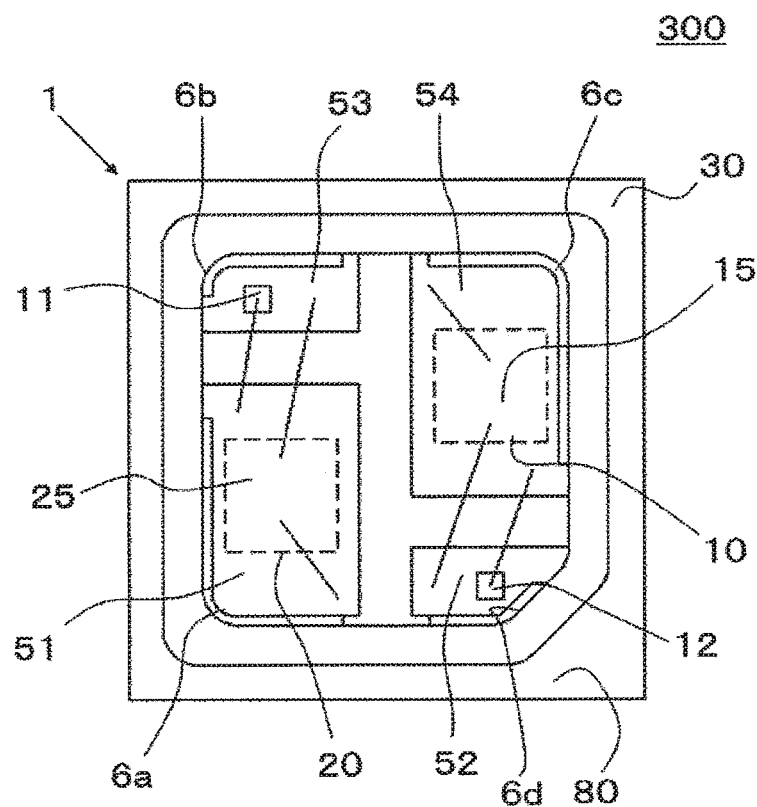
FIG. 9A is a schematic top view showing a variation of the light emitting device according to the third embodiment.
Figure 9B:
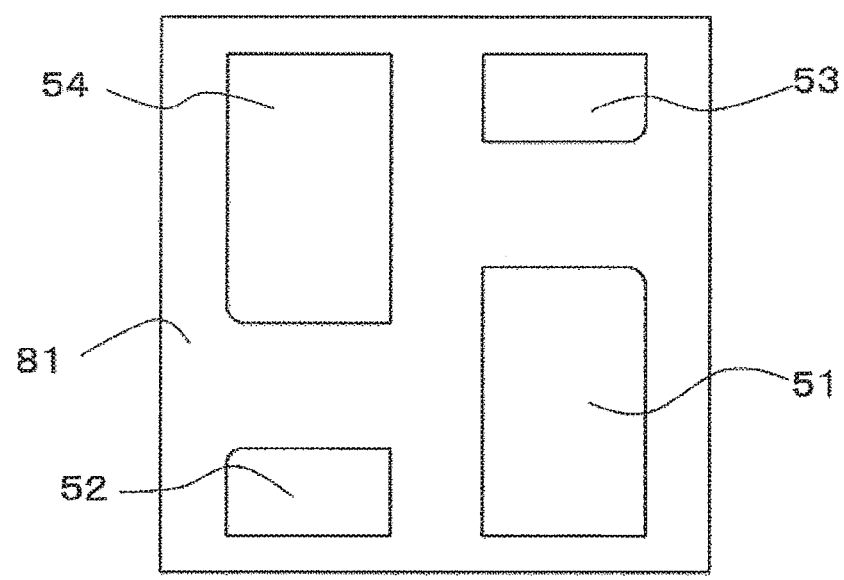
FIG. 9B is a schematic bottom view showing a variation of the light emitting device according to the third embodiment.
Figure 9C:
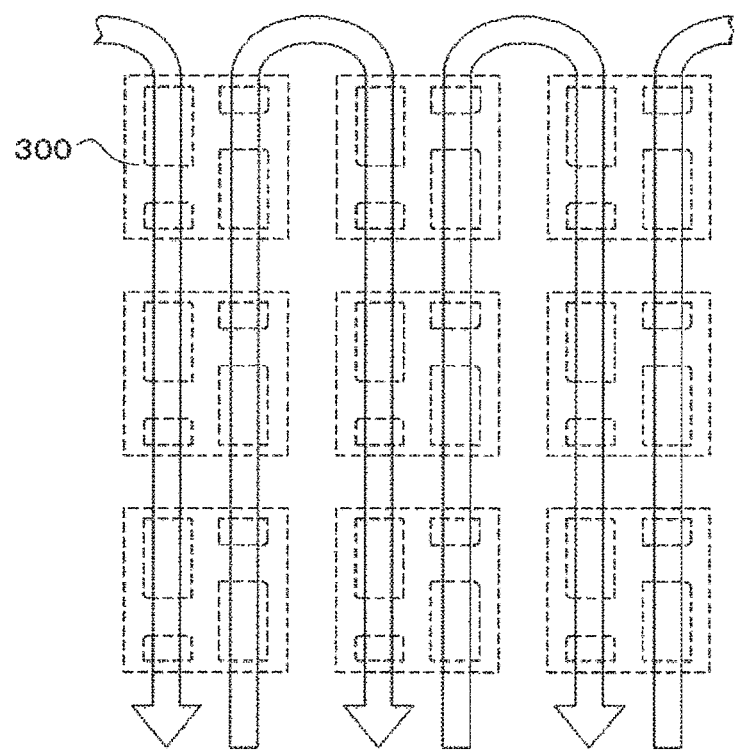
FIG. 9C is a diagram showing an example of conduction paths for a plurality of light emitting devices.

In the light emitting device 300, moreover, the leads 50 can be arranged as shown in FIG. 9A and FIG. 9B. The light emitting device 300 shown in FIG. 9A and FIG. 9B includes corners 6a, 6b, 6c, and 6d at the bottom face of the recess 2 where the first light emitting element 10 is positioned near the corner 6a, the first protection device 11 is positioned near the corner 6b, the second light emitting element 20 is positioned near the corner 6c, and the second protection device 11 is positioned near the corner 6d. That is, the first light emitting element 10 and the second light emitting element 20 are diagonally positioned, and the first protection device 11 and the second protection device 12 are diagonally positioned. In the light emitting device 300, arranging the leads 50 as described above can simplify the routing in the wiring pattern on the mounting substrate as shown in FIG. 9C, for example. In FIG. 9C, for example, the first light emitting elements 10 in the light emitting devices 300 arranged in one column are serially connected to the second light emitting elements 20 in the light emitting devices 300 arranged in the adjacent columns, and the first light emitting element 10 and the second light emitting element 20 in each light emitting device 300 are independently driven. The wiring pattern of the mounting substrate can be appropriately selected from various patterns.

Fourth Embodiment

Figure 10A:
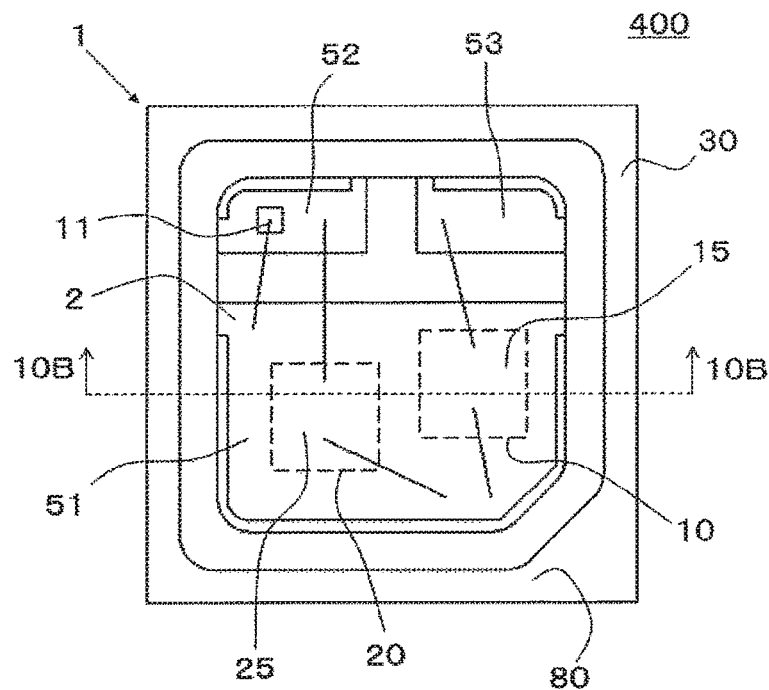
FIG. 10A is a schematic top view of the light emitting device according to a fourth embodiment.
Figure 10B:
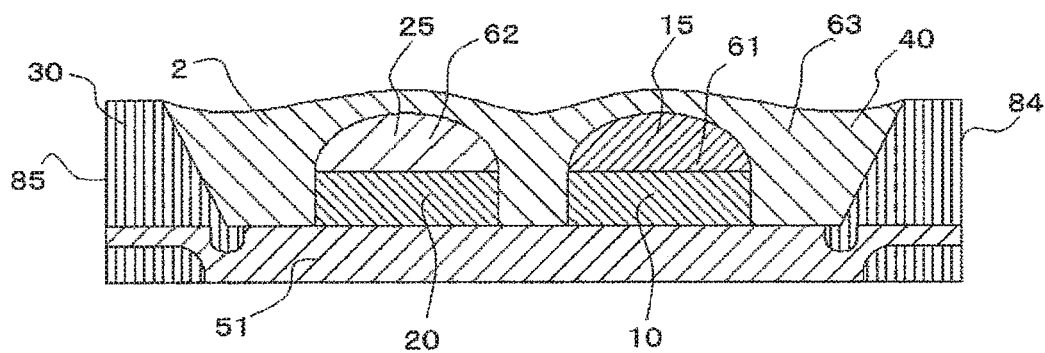
FIG. 10B is a schematic end view taken along the line 10B-10B in FIG. 10A.

FIG. 10A is a schematic top view of the light emitting device 400, and FIG. 10B is a schematic bottom view of the light emitting device 400, according to a fourth embodiment. The light emitting device 400 primarily differs from the light emitting device 100 according to the first embodiment in containing a third phosphor 62 in the second light transmissive member 25. Accordingly, the light emitting device 400 will be explained by focusing on the second light transmissive member 25 and the third phosphor 62.

In the light emitting device 400, the first light transmissive member 15 contains a first phosphor 61, and the second light transmissive member 25 contains a third phosphor 62. Including the third phosphor 62 in the second light transmissive member 25 can more easily create a difference between the chromaticity of the light exiting from the first light transmissive member 15 and the chromaticity of the light exiting from the second light transmissive member 25.

As one example, the third phosphor 62 has the same composition as that of the first phosphor 61. In the case of employing a phosphor of the same composition for the first phosphor 61 and the third phosphor 62, the amount of the first phosphor 61 contained in the first light transmissive member 15 differs from the amount of third phosphor 62 contained in the second light transmissive member 25. In the case of using a red phosphor of the same composition for the first phosphor 61 and the third phosphor 62, for example, by using different phosphor contents, the x chromaticity value of the emitted light from the one having a larger red phosphor content can be made relatively higher. By using a phosphor of the same composition, the chromaticity of the light exiting from each light transmissive member can be easily adjusted to allow the light emitting device to exit a desired mixed color light in an efficient manner.

As another example, the third phosphor 62 is a phosphor that emits short-wavelength light while the first phosphor 61 is a phosphor that emits long-wavelength light. For example, a red phosphor emitting red light is used for the first phosphor 61, and a phosphor emitting blue to green light for the third phosphor 62. This can make the x chromaticity value of the light exiting from the first light transmissive member 15 relatively large, and make the x chromaticity value of the light exiting from the second light transmissive member 25 relatively small.

The first light emitting element 10 and the second light emitting element 20 can have substantially the same peak emission wavelength (e.g., within a tolerance range of 5 nm). This can easily make the chromaticity of the light exiting from the first light transmissive member 15 different from the chromaticity of the light exiting from the second light transmissive member 25 in the case, for example, of using different types of phosphors for the first phosphor 61 and the third phosphor 62.

Alternatively, the first light emitting element 10 and the second light emitting element 20 can have peak emission wavelengths that are at least 10 nm apart. In this manner, even when a phosphor of the same composition is used for both the first phosphor 61 and the third phosphor 62, the chromaticity of one can be easily made different from that of the other.

The features of the light emitting device explained with reference to one of the first to the fourth embodiments can suitably be applied to those of the other embodiments. Moreover, in the first embodiment and the like, instances where the x chromaticity value of the light emitted upwards from the first light emitting element 10 is larger than the x chromaticity value of the light emitted upwards from the second light emitting element 20 have been primarily explained, but the present disclosure is not limited to these.

What is claimed is:

1. A light emitting device comprising:
   a first light emitting element and a second light emitting element, each having a peak emission wavelength in a range of 430 nm to 480 nm, and each comprising a positive electrode and a negative electrode at an upper face thereof;
   a first light transmissive member disposed on the upper face of the first light emitting element and containing a first phosphor;
   a second light transmissive member disposed on the upper face of the second light emitting element; and
   an encapsulant covering the first light transmissive member and the second light transmissive member and disposed between the first light emitting element and the second light emitting element, wherein the encapsulant contains a second phosphor,
   wherein the first light emitting element and the second light emitting element are configured to be independently driven,
   wherein a chromaticity of light exiting from the first light transmissive member differs from a chromaticity of light exiting from the second light transmissive member,
   wherein, in a cross-sectional view, an upper face of the encapsulant includes a first region above the first light emitting element, a second region above the second light emitting element, and a third region between the first region and the second region, and
   wherein a maximum height of the first region and a maximum height of the second region are greater than a maximum height of the third region.

2. The light emitting device according to claim 1, wherein the first phosphor is a red phosphor adapted to emit red light.

3. The light emitting device according to claim 1, wherein:
   the light emitting device comprises a package having a recess, and
   the first light emitting element and the second light emitting element are disposed at a bottom of the recess.

4. The light emitting device according claim 1, wherein the second light transmissive member is substantially free of phosphor.

5. The light emitting device according to claim 1, wherein:
   the first light transmissive member does not cover lateral faces of the first light emitting element, and the second light transmissive member does not cover lateral faces of the second light emitting element.

6. The light emitting device according to claim 1, wherein the light emitting device is configured to emit light having a color temperature in a range of 2700 to 3000 K when only the first light emitting element is driven, and is configured to emit light having a color temperature in a range of 5000 to 6500 K when only the second light emitting element is driven.

7. The light emitting device according to claim 1, wherein the light emitting device is configured to emit light having a color temperature in a range of 2700 to 6500 K.

8. The light emitting device according to claim 1, wherein the first and second phosphors are adapted such that a wavelength of light emitted from the second phosphor is shorter than a wavelength of light emitted from the first phosphor.

9. The light emitting device according to claim 1, further comprising:
a first lead, a second lead, and a third lead,
wherein the first light emitting element and the second light emitting element are disposed on an upper face of the first lead.

10. The light emitting device according to claim 1, further comprising:
a first lead, a second lead, a third lead, and a fourth lead,
wherein the first light emitting element is disposed on an upper face of the first lead,
wherein the second light emitting element is disposed on an upper face of the second lead,
wherein the third lead is electrically connected to one of electrodes of the first light emitting element, and
wherein the fourth lead is electrically connected to one of electrodes of the second light emitting element.

11. The light emitting device according to claim 1, wherein the first light transmissive member and the second light transmissive member have upper faces that are entirely curved.

12. The light emitting device according to claim 1, wherein:
the first light transmissive member does not cover lateral faces of the first light emitting element, and the second light transmissive member does not cover lateral faces of the second light emitting element, and
the first and second phosphors are adapted such that a wavelength of light emitted from the second phosphor is shorter than a wavelength of light emitted from the first phosphor.

13. The light emitting device according to claim 1, wherein:
the first phosphor is a red phosphor adapted to emit red light, and
the first light transmissive member does not cover lateral faces of the first light emitting element, and the second light transmissive member does not cover lateral faces of the second light emitting element.

14. The light emitting device according to claim 1, wherein:
the second light transmissive member is substantially free of phosphor, and
the first light transmissive member does not cover lateral faces of the first light emitting element, and the second light transmissive member does not cover lateral faces of the second light emitting element.

15. The light emitting device according to claim 1, wherein:
the first light transmissive member does not cover lateral faces of the first light emitting element, and the second light transmissive member does not cover lateral faces of the second light emitting element, and
the light emitting device is configured to emit light having a color temperature in a range of 2700 to 3000 K when only the first light emitting element is driven, and is configured to emit light having a color temperature in a range of 5000 to 6500 K when only the second light emitting element is driven.

16. The light emitting device according to claim 1, wherein:
the first light transmissive member does not cover lateral faces of the first light emitting element, and the second light transmissive member does not cover lateral faces of the second light emitting element, and
the first light transmissive member and the second light transmissive member have upper faces that are entirely curved.

17. The light emitting device according to claim 1, wherein:
the second light transmissive member is substantially free of phosphor,
the first light transmissive member does not cover lateral faces of the first light emitting element, and the second light transmissive member does not cover lateral faces of the second light emitting element, and
the first and second phosphors are adapted such that a wavelength of light emitted from the second phosphor is shorter than a wavelength of light emitted from the first phosphor.

18. The light emitting device according to claim 1, wherein:
the first phosphor is a red phosphor adapted to emit red light,
the second light transmissive member is substantially free of phosphor,
the first light transmissive member does not cover lateral faces of the first light emitting element, and the second light transmissive member does not cover lateral faces of the second light emitting element, and
the first and second phosphors are adapted such that a wavelength of light emitted from the second phosphor is shorter than a wavelength of light emitted from the first phosphor.

19. The light emitting device according to claim 1, wherein the encapsulant is in contact with a lateral face of the first light emitting element and a lateral face of the second light emitting element.

20. The light emitting device according to claim 1, wherein each and every light emitting element included in the light emitting device has a peak emission wavelength in a range of 430 nm to 480 nm.

21. The light emitting device according to any of claims 1 to 3, wherein the second light transmissive member contains a third phosphor.

22. The light emitting device according to claim 21, wherein:
a composition of the first phosphor is the same as a composition of the third phosphor, and
an amount of the first phosphor contained in the first light transmissive member differs from an amount of the third phosphor contained in the second light transmissive member.

* * * * *